US012648241B2

(12) United States Patent
Matsunaga et al.

(10) Patent No.: US 12,648,241 B2
(45) Date of Patent: ***Jun. 2, 2026

(54) PIXEL CIRCUIT AND IMAGE SENSOR

(71) Applicant: OmniVision Technologies, Inc., Santa Clara, CA (US)

(72) Inventors: Yoshiyuki Matsunaga, Kyoto (JP); Cynthia Lee, Santa Clara, CA (US); Keiji Mabuchi, Cupertino, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 371 days.

This patent is subject to a terminal disclaimer.

(21) Appl. No.: 18/456,659

(22) Filed: Aug. 28, 2023

(65) Prior Publication Data

US 2025/0081640 A1 Mar. 6, 2025

(51) Int. Cl.
*H10F 39/00* (2025.01)
*H10F 39/18* (2025.01)

(52) U.S. Cl.
CPC ....... *H10F 39/8033* (2025.01); *H10F 39/184* (2025.01)

(58) Field of Classification Search
CPC ............... H10F 39/8033; H10F 39/184; H10F 39/80377; H04N 25/44; H04N 25/53
See application file for complete search history.

(56) References Cited

U.S. PATENT DOCUMENTS

| | | | | |
|---|---|---|---|---|
| 12,289,553 | B2 * | 4/2025 | Matsunaga | ............ H04N 25/63 |
| 2006/0285000 | A1 * | 12/2006 | Mabuchi | ................ H04N 25/59 |
| | | | | 348/E3.018 |
| 2007/0241347 | A1 * | 10/2007 | Ichikawa | .......... G02F 1/136277 |
| | | | | 257/88 |
| 2016/0165165 | A1 * | 6/2016 | Chen | .................... H04N 25/766 |
| | | | | 348/308 |
| 2021/0084243 | A1 * | 3/2021 | Ni | ........................... H04N 25/77 |
| 2021/0118927 | A1 * | 4/2021 | Lee | ..................... H10F 39/8057 |
| 2021/0225922 | A1 | 7/2021 | Na et al. | |
| 2023/0029874 | A1 * | 2/2023 | Chen | ..................... H10F 39/807 |
| 2024/0205564 | A1 * | 6/2024 | Zhou | .................. H10F 39/8037 |

OTHER PUBLICATIONS

Yang Ni and K. Matou, "A CMOS log image sensor with on-chip FPN compensation," Proceedings of the 27th European Solid-State Circuits Conference, Villach, Austria, 2001, pp. 101-104.

* cited by examiner

*Primary Examiner* — Bitew A Dinke

(57) ABSTRACT

A pixel circuit including a transistor, a blocking layer and an output circuit is disclosed. The transistor includes a first doped region and a second doped region disposed on opposite sides of a channel of the transistor proximate to a first surface of a semiconductor substrate such that photo-carriers generated inside the semiconductor substrate in response to incident light flow into one region of the first and second doped regions. The blocking layer is disposed between the other region of the first and second doped regions and a second surface of the semiconductor substrate opposite to the first surface. The blocking layer is configured to block the photo-carriers from flowing into the other region of the first doped region and the second doped region directly. The output circuit outputs an image signal according to a voltage signal outputted from the transistor.

19 Claims, 15 Drawing Sheets

PIXEL CIRCUIT AND IMAGE SENSOR

TECHNICAL FIELD

The present disclosure relates to a pixel circuit and an image sensor that operates in a solar cell mode.

BACKGROUND

In an image sensor, increasing the dynamic range is desirable. To this end, an image sensor that operates in a solar cell mode using the logarithmic characteristics of a diode is known, and the dynamic range can be increased.

U.S. Ser. No. 20210084243A1 illustrates an example of a configuration of an image sensor that operates in a solar cell mode. Note that logarithmic characteristics are also referred to as diode characteristics or exponential function characteristics, and a mode using these characteristics is referred to as a solar cell mode.

If light is incident on the pixels of an image sensor, carriers (electrons or holes) are generated by the light. The generated carriers move to a p-n junction and recombine at crystal defects on the surface thereof, and the photo-voltage generated at the output of the pixels is determined by the recombination speed of the carriers. Moreover, the recombination speed is related to the energy levels of the crystal defects and the number of crystal defects.

On the other hand, the crystal defects on the surface of the p-n junction vary greatly depending on the fabrication method. Consequently, variations appear in the V-I curve that indicates the relationship between the photo-voltage generated from the pixels and the photocurrent due to the movement of the carriers in the pixels, and the output from the pixels will vary. Such variations in each of the pixels acts as fixed-pattern noise in an image sensor in which the pixels are arranged two-dimensionally. In addition, the variations tend to increase with smaller pixels, and therefore the problem intensifies when obtaining high-resolution images.

SUMMARY

One aspect of the present disclosure provides a pixel circuit of an image sensor, the pixel circuit comprising a phototransistor, a blocking layer, and an output circuit. The phototransistor including a source and a drain disposed on opposite sides of a channel proximate to a first surface (e.g., front surface) of a semiconductor substrate such that photo-carriers generated inside the semiconductor substrate due to incident light flow into one region of the source and the drain. The phototransistor outputs a voltage signal from the one region of the source and the drain. The blocking layer is disposed underneath the other region of the drain and the source and the far side from the surface portion of the channel that is formed proximate to the first surface. The blocking layer may be disposed between the other region of the drain and the source and a second surface (e.g., back surface) of the semiconductor substrate, wherein the second surface is opposite to the first surface. The blocking layer blocks the photo-carriers from flowing into the other region of the drain or the source directly. The output circuit outputs an image signal according to the voltage signal outputted from the phototransistor. The phototransistor allows a flow of a subthreshold current between the source and the drain while the phototransistor operating in a pinched-off state in which photo-carriers pass through a bulk channel region of the channel at a position apart from the first surface of the semiconductor substrate.

Another aspect of the present disclosure provides a pixel circuit of an image sensor, the pixel circuit comprising a photodiode, a transistor, a blocking layer, and an output circuit. The transistor includes a gate electrode, a first doped region and a second doped region. The first doped region and the second doped region disposed on opposite sides of a channel of the transistor proximate to a first surface of a semiconductor substrate such that photo-carriers generated inside the semiconductor substrate in response to an incident light flow into the second doped region. The transistor is coupled to output a voltage signal from the first doped region, wherein the voltage signal is generated in response to an amount of photo-carriers generated. The blocking layer is disposed in the semiconductor substrate between the second doped region and a second surface of the semiconductor substrate opposite to the first surface. The blocking layer operates to block the photo-carriers from flowing into the second doped region directly.

In some embodiments, the photodiode is disposed on a first semiconductor substrate and the transistor is disposed or otherwise fabricated on a second semiconductor substrate, wherein the first semiconductor substrate and the second semiconductor substrate is bonded or otherwise coupled together. In some embodiments, the blocking layer and the output circuit may be disposed on the first semiconductor substrate. In other embodiments, the blocking layer may be omitted from the first semiconductor substrate.

Each of the first doped region and the second doped region is of a first conductivity type opposite to a second conductivity type of the blocking layer. The first conductivity type may be of N-type and the second conductivity type may be of P-type.

Further another aspect of the present disclosure provides a pixel circuit of an image sensor, the pixel circuit comprising a photodiode, a pinch-off transistor, and an output circuit. The photodiode is formed in a p-type doped germanium (Ge) region. The photodiode has a p-n junction sensitive to infrared rays, and configured to generate photo-carriers in response to incident light. The pinch-off transistor formed on a silicon (Si) substrate, the pinch-off transistor is configured to electrically couple the photodiode to the output circuit. The pinch-off transistor includes a source and a drain disposed on opposite sides of a channel proximate to a first surface of the Si substrate such that photo-carriers from the photodiode are received into one region of the source and the drain. The output circuit is disposed on the Si substrate and which is coupled to output an image signal according to a voltage signal outputted from the one region of the source and the drain of the pinch-off transistor. The one region of the pinch-off transistor is configured to generate the voltage signal based on an amount of photo-carriers generated. The pinch-off transistor allows a flow of a subthreshold current in a pinched-off state in which photo-carriers pass through a bulk channel region of the channel at a position apart from the surface of the Si substrate.

In some embodiments, the p-type Ge region is coupled or otherwise adjusted to have a negative voltage with respect to a voltage (e.g., a ground reference voltage) of the Si substrate.

In some embodiments, the blocking layer is disposed in the Si substrate between the drain and a second surface of the Si substrate opposite to the first surface. The blocking layer operates to block the photo-carriers from flowing into the drain directly.

It is appreciated that the blocking layer may be omitted if no photoelectric conversion takes place inside the silicon substrate. For example, in an embodiment, where the photodiode is formed on a SiGe substrate that is bonded to the Si substrate having the pinch-off transistor formed thereon via bonding scheme such as oxide bonding or hybrid bonding scheme. In such embodiment the blocking layer may be omitted from the silicon substrate.

Also, another aspect of the present disclosure relates to an image sensor using the above pixel circuit.

In further another aspect of the present disclosure relates to an image sensor including one or more the above-mentioned pixel circuits arranged to form a pixel array.

According to the present disclosure, an image sensor that operates in a solar cell mode can be obtained, and variations of the pixel circuit can be suppressed.

BRIEF DESCRIPTION OF DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale with emphasis instead being placed upon illustrating the principles being described.

4

Figure 12A:
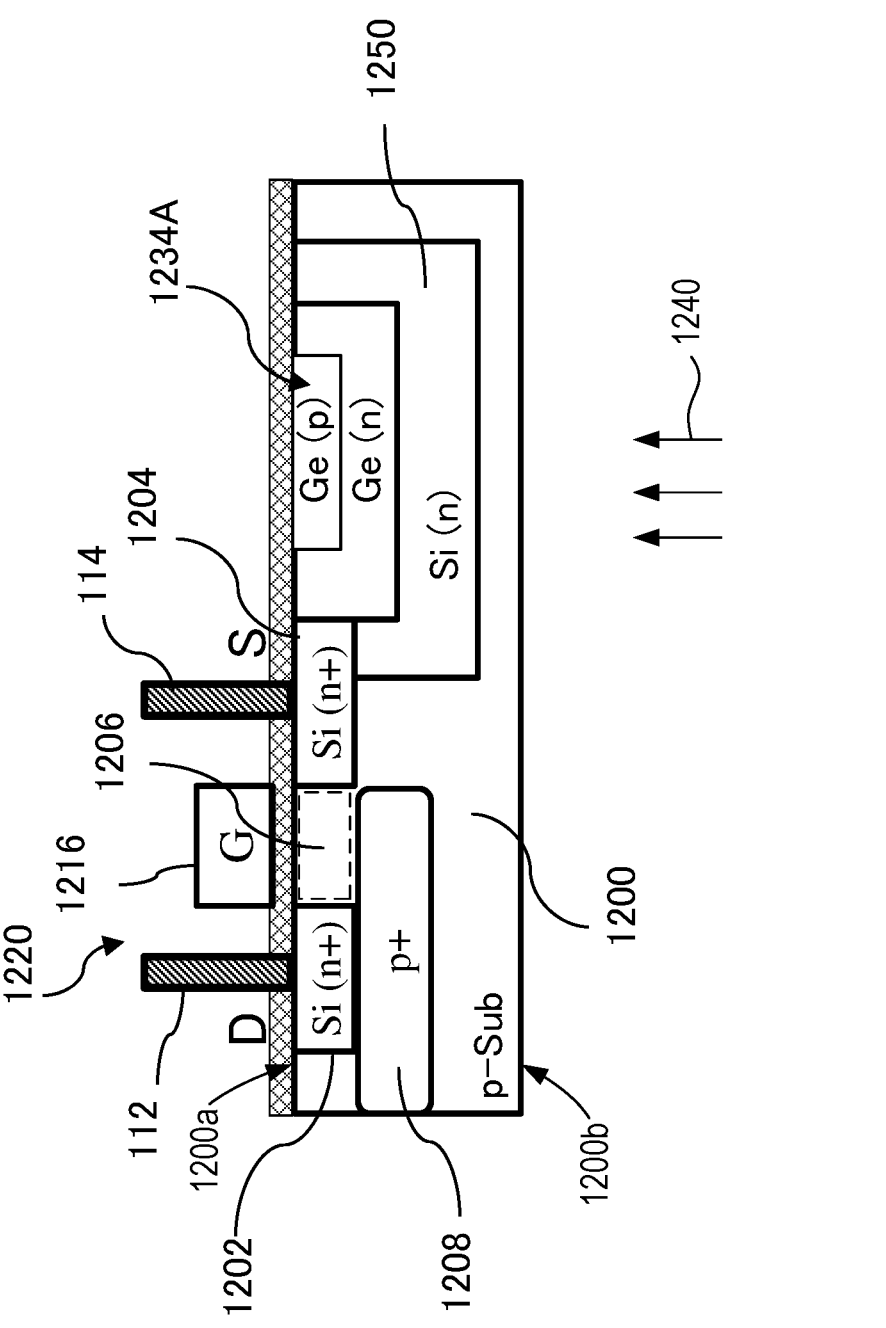
FIG. 12A illustrates a configuration in which a Ge photodiode is embedded in an n-type diffusion layer coupled to a source electrode of a pinch-off transistor according to an embodiment of the present disclosure.
Figure 12B:
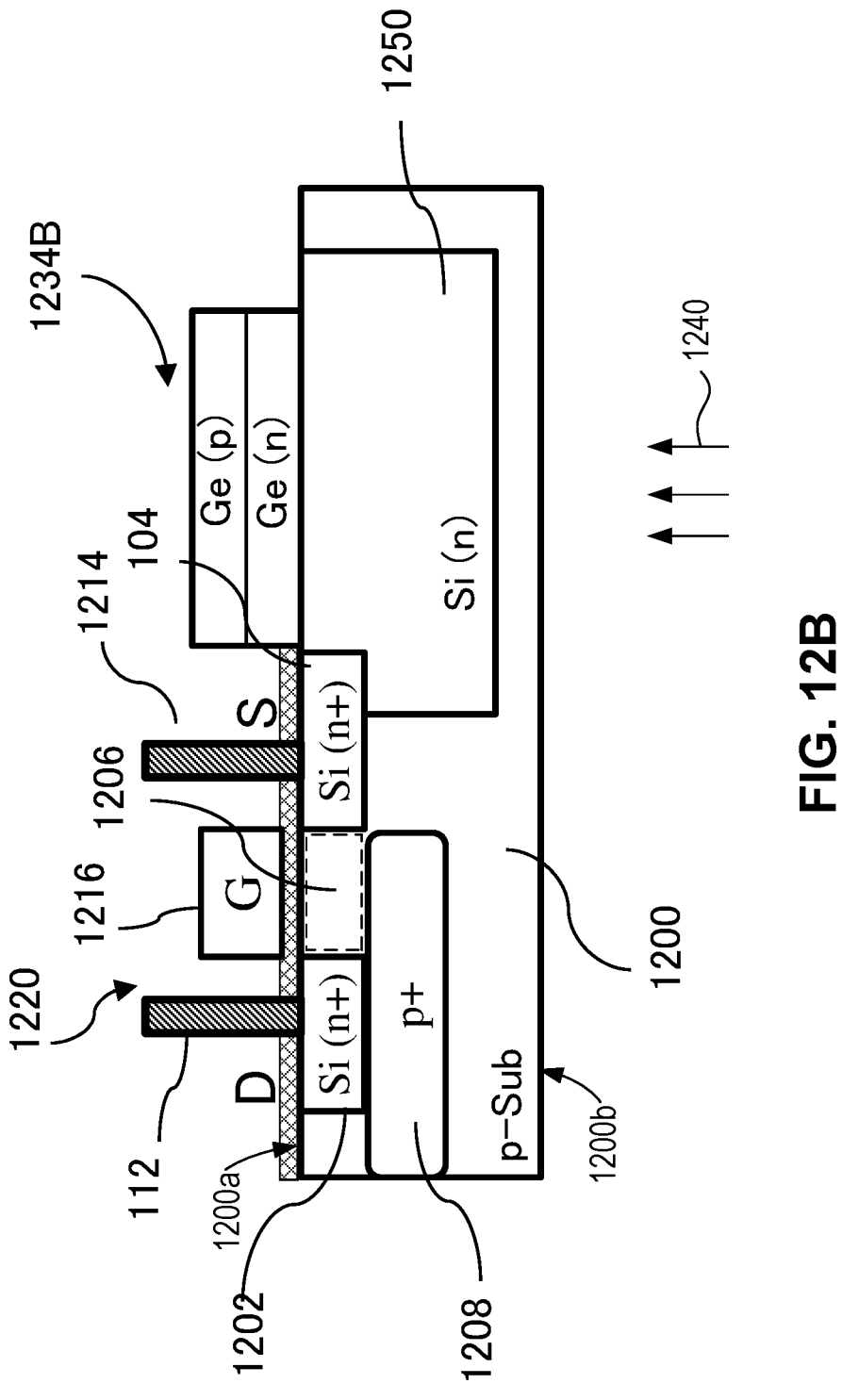
FIG. 12B illustrates a configuration in which a Ge photodiode is formed in an upper part of the n-type diffusion layer according to an embodiment of the present disclosure.
Figure 12C:
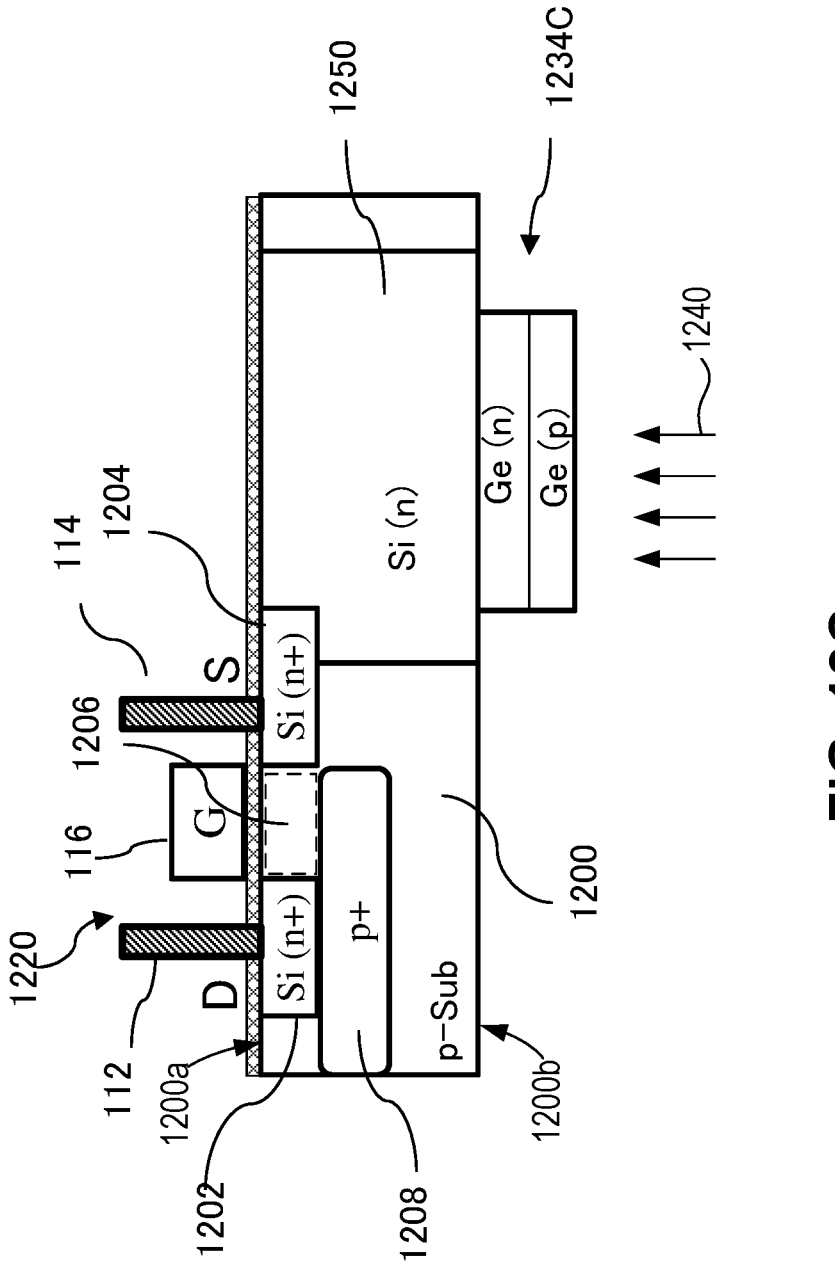

FIG. 12C illustrates a configuration in which the Ge photodiode is disposed on a rear-surface side of the silicon substrate according to an embodiment of the present disclosure.

Figure 13:
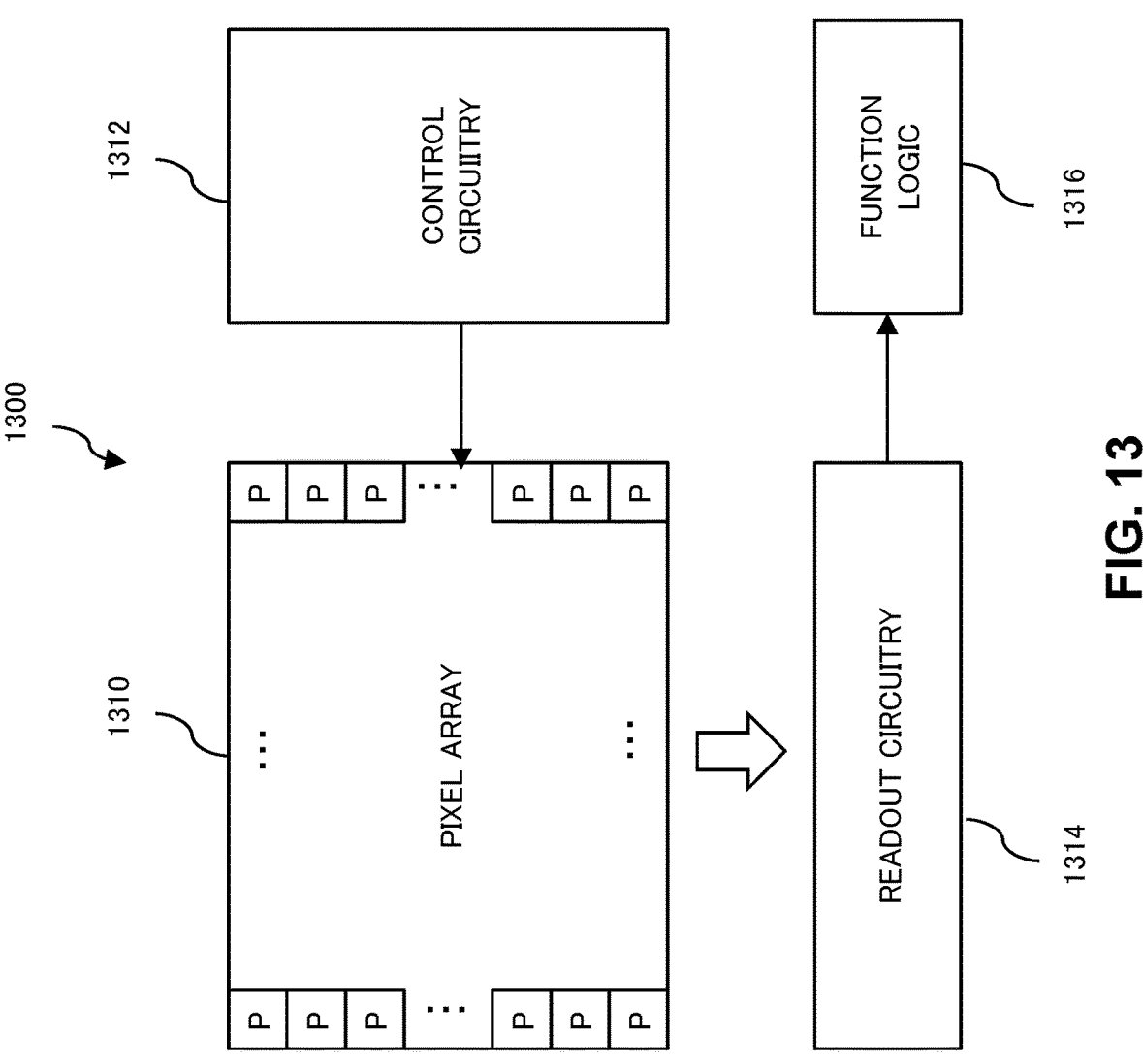

FIG. 13 is a block diagram showing a structure of an image sensor according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging sensor with a pixel array including a plurality of pixel circuits, each having a phototransistor that operate in a solar-cell mode are described herein. In various examples, such phototransistor that is biased to operate in pinch-off state and a pinch-off transistor have same meaning, and are interchangeably. In the following providing reduced image lag are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" or "underneath" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

It is appreciated that the term "semiconductor substrate" throughout the disclosure may correspond to a part of or an entirety of a semiconductor wafer (e.g., a silicon wafer).

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

(Pixel Circuit Configuration)

Figure 1:
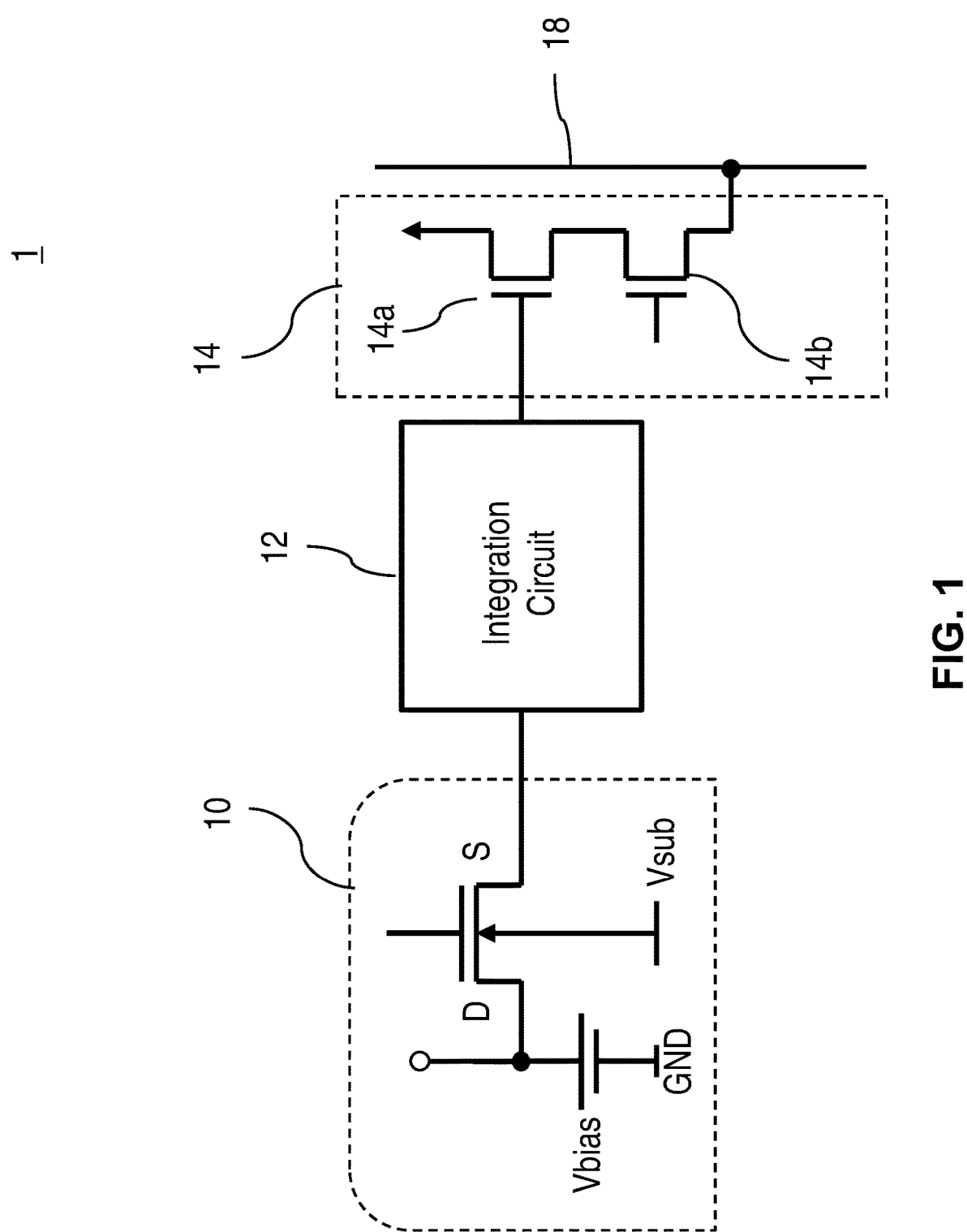
FIG. 1 is a view illustrating a configuration of a pixel circuit of an image sensor according to an embodiment of the present disclosure.

FIG. 1 is a view illustrating a configuration of a pixel circuit of an image sensor according to the embodiment of the present disclosure. A pixel circuit 1 may be included in a plurality of pixel circuits in a pixel array of an image sensor. In various examples, the pixel array is a two-dimensional (2D) array including a plurality of pixel circuits 1 that are arranged into rows and columns to acquire image data of a person, a place, a scene, an object, etc., which can then be used to render an image of a person, a place, a scene, an object, etc.

The pixel circuit 1 may include a phototransistor 10, an integration circuit 12, and an output circuit 14. In embodiment of FIG. 1, the phototransistor 10 is configured as an n-channel field-effect transistor (FET) disposed on a semiconductor substrate. Additionally, photo-carriers (e.g., electrons) generated by the incidence of light enter a source S of the phototransistor 10 from a p-n junction formed in the semiconductor substrate, and the source voltage falls in relation to amount of light incident on the phototransistor 10. In the same or different embodiments, the p-n junction may be formed between the source S of the phototransistor 10 and a substrate region of the semiconductor substrate surrounding the source S of the phototransistor 10. A drain D of the phototransistor 10 may be electrically coupled to a voltage source Vbias to receive a bias voltage. Note that in the diagram, the voltage generated at the source S due to the introduction of one or more electrons is illustrated as a voltage signal. Note that, as will be described later, the phototransistor 10 is configured to operate in a pinched-off state, for example during an integration or exposure period of the pixel circuit and a subthreshold current flows to a bulk channel region within a channel of the phototransistor 10 that is not a depleted region, and therefore logarithmic characteristics are obtained in the source S in response to number of electrons introduced to the source S by the incidence of light. In other words, the phototransistor 10 operates in a solar cell mode (may also refer as a photovoltaic mode).

The source S of phototransistor 10 is electrically connected to integration circuit 12 to output an image signal based on photo-current (or amount of photo-carriers) generated response to incident light received. The integration circuit 12 integrates the output from source S of phototransistor 10 over a definite time, and outputs a stabilized voltage. The integration circuit 12 is electrically connected to an output circuit 14. The output circuit 14 may include a source-follower transistor 14a and a row-select transistor 14b. The output of the integration circuit 12 is electrically connected to a gate of source-follower transistor 14a for signal amplification. The source-follower transistor 14a may be an n-channel FET in which a drain thereof is electrically connected to a power source having a prescribed or predefined potential, and a source thereof is electrically connected to a drain of the row-select transistor 14b. In some embodiments, the source of source-follower transistor 14a and the drain of row-select transistor 14b may be formed as a common junction region. The row-select transistor 14b may be an n-channel FET in which the drain thereof is connected to an output line 18 (e.g., a readout bitline) arranged in a column direction of the pixel array.

Consequently, when row-select transistor 14b turns on, for example by a row-select signal, a current corresponding to the gate potential of the source-follower transistor 14a flows into source-follower transistor 14a and a corresponding image signal is outputted to output line 18. In embodiments, the row-select signal is supplied to the gate of row-select transistor 14b, and by having the row-select signal go to H level at a prescribed timing turning on row-select transistor 14b, the image signal corresponding to the amount of light received by a pixel, which has been integrated by integration circuit 12, is outputted to output line 18 for signal readout.

[Configuration of Phototransistor]

Figure 2:
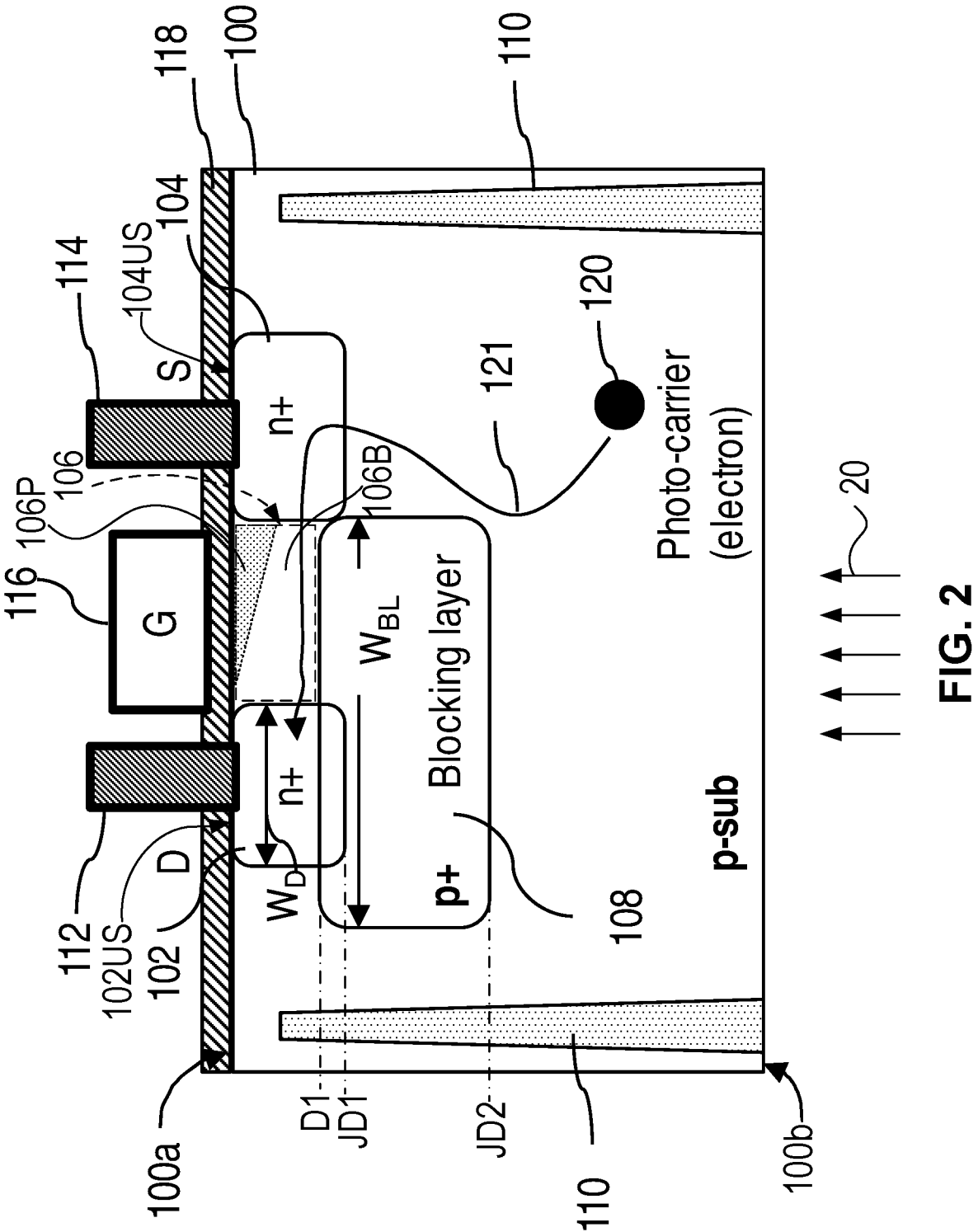
FIG. 2 is a schematic diagram illustrating a configuration of a phototransistor according to an embodiment of the present disclosure.

FIG. 2 is a partial cross-sectional schematic diagram illustrating a configuration of a single phototransistor 10 that may be included in a pixel circuit of a plurality of pixel circuits in a pixel array of an image sensor. The phototransistor 10 is a metal-oxide-semiconductor field-effect transistor (MOSFET). The phototransistor 10 includes a gate electrode 116, a gate oxide film 118, a drain 102, a source 104, and a blocking layer 108. It is appreciated that certain elements may be omitted or unlabeled (e.g., contact to gate electrode 116, optical elements such as color filter, microlens, and metal layers for signal routing, other part of pixel circuitries such as ones illustrated in FIG. 5 and FIG. 8, and so on) to avoid obscuring certain aspects of the disclosure.

The phototransistor 10 is disposed on a semiconductor substrate 100. In the illustrated example, the semiconductor substrate 100 is a semiconductor substrate doped with p-type impurities, which may be referred as a p-type doped semiconductor substrate, and may be denoted as p-sub, however in other example the semiconductor substrate 100 may be an n-type doped semiconductor substrate. It is appreciated that semiconductor substrate 100 may be a silicon substrate, a silicon germanium alloy, germanium, a silicon carbide alloy, an indium gallium arsenide alloy, any other alloys formed of III-V compounds, other suitable semiconductor materials or alloys, combinations thereof, a bulk substrate thereof, or a wafer thereof. It is appreciated that semiconductor substrate 100 may also be an epitaxial substrate. More specifically, the semiconductor substrate 100 may correspond to any semiconductor material or combination of materials that may be doped or otherwise configured to include the plurality of pixel circuits of the pixel array of the image sensor. In one embodiment, the semiconductor substrate 100 is formed of intrinsic or extrinsic silicon having regions doped sufficiently to form the plurality of phototransistors 10. It is further appreciated that in some embodiments, semiconductor substrate 100 may have at least a semiconductor layer that is epitaxially grown thereon (e.g., formed via epitaxy technique). In such embodiments, phototransistor 10 is formed in the semiconductor layer. The semiconductor substrate 100 may have a first surface 100a and a second surface 100b opposite to the first surface 100a. In the same or different embodiments, the first surface 100a may be referred as a non-illuminated surface of the semiconductor substrate 100 and the second surface 100b may be referred as an illuminated surface of the semiconductor substrate 100.

In some embodiments, the semiconductor substrate 100 may include a semiconductor layer such as an epitaxial layer that is grown on the semiconductor substrate 100. In such embodiments, the drain 102, the source 104, and the blocking layer 108 may be formed within the epitaxial layer via ion implantation or otherwise disposed in the epitaxial layer on the semiconductor substrate 100. The first surface 100a may then be referred to a surface of the epitaxial layer being opposite to the second surface 100b.

The gate electrode 116 is disposed proximate to first surface 100a of the semiconductor substrate 100. In the illustrated embodiment, a gate oxide is disposed in between gate electrode 116 and first surface 100a of semiconductor substrate 100. On first surface 100a of the p-type semiconductor substrate 100, source 104 and drain 102 are formed with a prescribed distance apart via photolithography and ion implantation processes. The gate electrode 116 is configured to couple source 104 to drain 102.

Source 104 and drain 102 are disposed in semiconductor substrate 100, for example by ion implantation. Each of source 104 and drain 102 may be a doped region having a conductivity type opposite to semiconductor substrate 100. In some embodiments, source 104 and drain 102 are semiconductor regions in semiconductor substrate 100 doped with a high concentration of n-type impurities. Each of source 104 and drain 102 may be referred as an n+ doped region. The region interposed between the source 104 and the drain 102 is a channel 106 form underneath gate electrode 116 in the semiconductor substrate 100.

The blocking layer 108 is a doped region in the semiconductor substrate 100, and the blocking layer 108 has a conductivity type different from a conductivity type of each of the source 104 and the drain 102. The block layer 108 may have same type of conductivity as semiconductor substrate 100. In various examples, the blocking layer 108 is a region of semiconductor substrate 100 doped with a high concentration of p-type impurities. The blocking layer 108 may have an impurity concentration that is at least one order or magnitude higher than an impurity concentration of semiconductor substrate 100. In some embodiments, the impurity concentration of blocking layer 108 may be configured to be the same as an impurity concentration of drain 102. In some embodiments, the impurity concentration of blocking layer 108 may be configured to be higher than the impurity concentration of drain 102.

The blocking layer 108 may be disposed between drain 102 and second surface 100b of semiconductor substrate 100. The blocking layer 108 may span a space region in semiconductor substrate 100 that lies i) underneath drain 102 and ii) between drain 102 and source 104. In embodiments, the blocking layer 108 may be disposed underneath drain 102 and channel 106 such that when the phototransistor 10 operates in a pinch-off state, one or more photo-carriers 120 (e.g., electrons) generated flow from source 104 through a bulk channel region 106B of channel 106 into drain 102 and absorbed by drain 102 as illustrated by an example path 121 instead of flowing directly to drain 102. That is, blocking layer 108 operatively blocks photo-carriers 120 (e.g., electron) from directly flowing to drain 102, wherein photo-carriers 120 (e.g., electron) are generated in response to incident light 20 received incident on a detection region of phototransistor 10 through second surface 100b of semiconductor substrate 100. In one example, blocking layer 108 operatively form junction isolation with drain 102 providing electrical isolation between drain 102 and the region of semiconductor substrate 100 between blocking layer 108 and second surface 100b within the detection region of phototransistor 10. In embodiments, the bulk channel region 106B of the channel 106 of the phototransistor 10 is a non-depleted bulk channel region in semiconductor substrate 100 that is positioned away from first surface 100a, and between a pinch-off region 106P of channel 106 and blocking layer 108 in semiconductor substrate 100.

In an example operation, during an integration or exposure period, gate electrode 116 is coupled to receive a gate voltage of a zero or ground reference voltage while drain 102 is coupled to constantly receive a bias voltage greater than the gate voltage causing phototransistor 10 to operate in the pinch-off state. In the pinch-off state, a bulk channel region 106B, which is formed within the region of channel 106, is formed to operatively couple source 104 and drain 102 enabling a flow of a subthreshold current (or off-leakage current) between source 104 and drain 102 allowing photo-carrier 120 to flow from source 104 to drain 102 through the bulk channel region 106B without recombining in source 104, wherein the flow of a subthreshold current (or off-leakage current) between source 104 and drain 102 is exponentially related to number of one or more photo-carriers (e.g., photo-carrier 120) generated in source 104.

In some embodiments, the blocking layer 108 has a first region width $W_{BL}$ that is greater than a second region width $W_D$ of drain 102. The blocking layer 108 may be disposed at a depth D1 that is less than a junction depth JD1 of drain 102. The blocking layer 108 may have a junction depth JD2 that is greater than junction depth JD1. The depth differences between junction depth JD2 and depth D1 provide a depthwise region thickness for the blocking layer 108. In some embodiments, the blocking layer 108 overlaps with a part of drain 102 in a substrate thickness or a depth-wise direction. In some embodiments, blocking layer 108 is formed covering the underside region of drain 102 and channel 106. In some embodiments, blocking layer 108 may be arranged to laterally extend and in a direct contact with an edge of source 104 ensuring that the one or more photo-carriers 120 (e.g., electrons) generated flow from source 104 to drain 102 through the bulk channel region 106B of channel 106 of the phototransistor 10. In the semiconductor substrate 100, the region of the phototransistor 10 is isolated from the regions of adjacent phototransistors 10 by pixel isolation portions 110.

A source contact 114 is disposed on first surface 100a directly contacting an upper surface 104US of the source 104 to electrically connect source 104. Source contact 114 may electrically connect source 104 to an amplifier of the integration circuit 12. A drain contact 112 is disposed on first surface 100*a* and contacts an upper surface 102US of the drain 102 to electrically connect drain 102 to the bias voltage (e.g., provided by voltage source Vbias).

In the example described above, the semiconductor substrate 100 is a p-type silicon substrate (labeled p-sub in the diagram). The pixel isolation portions 110 may be formed from an insulating material such as silicon oxide. In some embodiments, each of pixel isolation portions 110 is a trench isolation structure. The pixel isolation portions 110 may be interconnected forming a grid defining a plurality of pixel regions for pixel circuits within the pixel array of the image sensor. The phototransistor 10 is disposed in a respective one of the plurality of pixel regions. Each of pixel isolation portions 110 may extend from a second surface 110*b* a depth into semiconductor substrate 100 that is less than a thickness of semiconductor substrate 100. The thickness of semiconductor substrate may range between 3 micrometers to 7 micrometers. One or more layers including surface passivation layer, anti-reflective coating, processing protective layer (e.g., oxide-based stress buffering layer) color filter layer and microlens may be formed on the second surface 100*b*.

The source contact 114 and drain contact 112 are formed from a metal such as tungsten, copper or aluminum. Gate electrode 116 is formed from poly silicon, silicide materials, or metal. Gate oxide film 118 is disposed between gate electrode 116 and first surface 100*a* of the semiconductor substrate 100. Gate oxide film 118 may have a depth-wise thickness ranging between 20 angstroms to 80 angstroms.

In the illustrated embodiment, the p-type semiconductor substrate 100 is connected to a prescribed low-voltage power source such as a ground, to which the holes generated by the incidence of light flow.

[Photodiode in Solar Cell Mode]

Figures 3A, 3B:
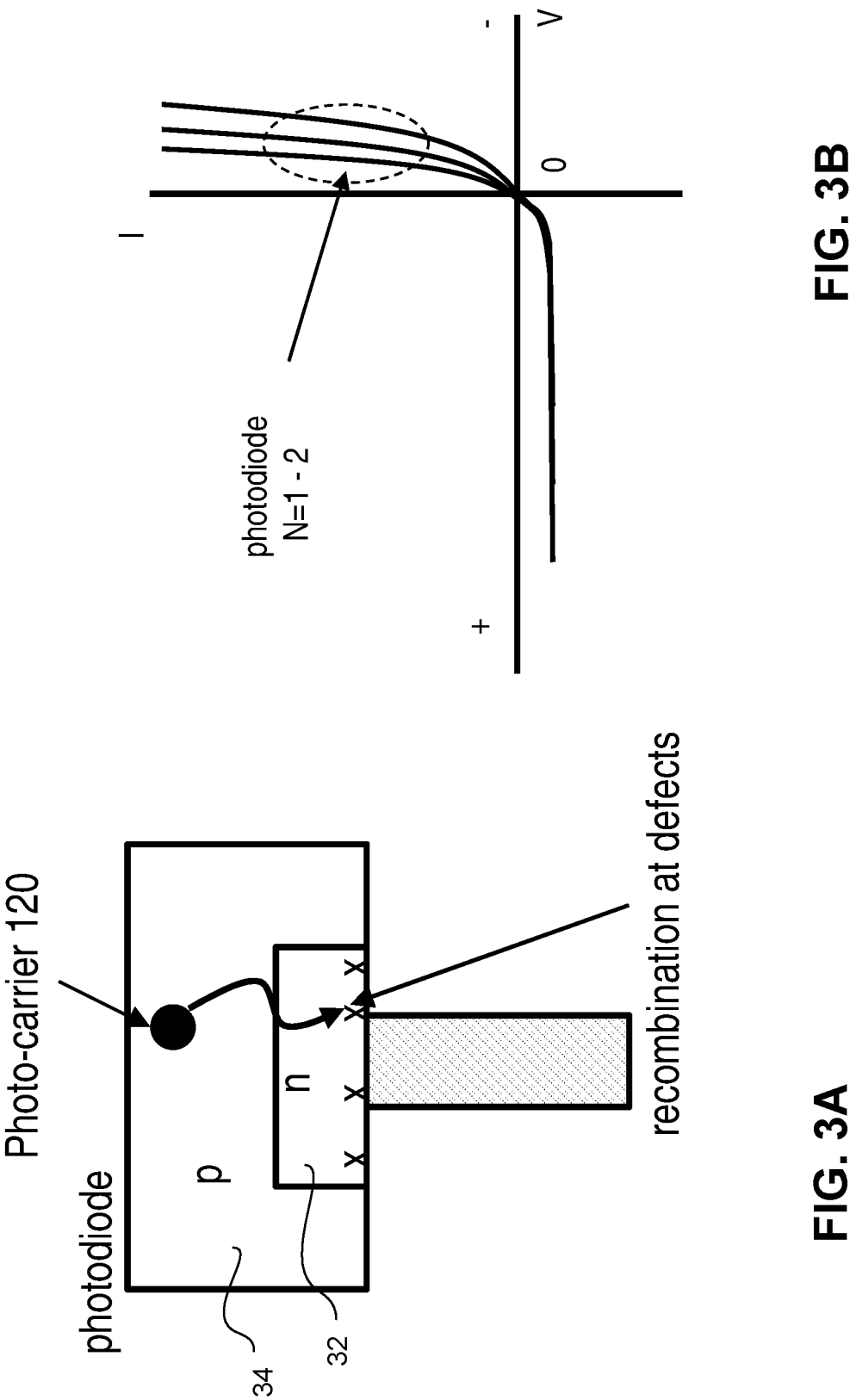
FIG. 3A is a diagram for describing a photocurrent in a photodiode in a solar cell mode according to an embodiment of the present disclosure.
FIG. 3B is a graph illustrating the V-I characteristics of a photodiode in a solar cell mode according to an embodiment of the present disclosure.

FIG. 3A is a diagram for describing a photocurrent in a photodiode in a solar cell mode. The photodiode includes an n-type doped region 32 and a p-type doped region 34. The n-type doped region 32 is surrounded by the p-type doped region 34, wherein the outer perimeter of the n-type doped region 32 and p-type doped region 34 forms a p-n junction of the photodiode. The photodiode is configured to operate in a solar cell or photovoltaic mode. In this way, photo-carriers (in this example, electrons) generated inside a photodiode recombine with holes at defects located on or proximate to the surface of an n-region denoted by "x" in the diagram, thereby causing a photocurrent to flow.

The V-I characteristic of the photodiode can be expressed by $$I \propto e^{\left[\frac{qV}{kTN}\right]} \tag{1}$$

where I is the output current, q is the elementary charge, k is the Boltzmann constant, T is the absolute temperature, V is the generated signal voltage at the source 104, and N is denoted as an emission coefficient.

Additionally, the emission coefficient N is determined according to the density and state of the surface defects of the semiconductor substrate 100, but the state of the surface defects varies depending on the photodiode fabrication process. It has been observed that, the emission coefficient N may have deviation in the range from 1 to 2.

FIG. 3B is a graph illustrating the V-I characteristics of a photodiode in a solar cell mode. In the diagram, the horizontal or x-axis represents the cathode node voltage or n-type doped region 32 (where left side is in a plus or positive direction, right side is in minus or negative direction), and the vertical or y-axis represents the amount of photocurrent. In this way, a slight current flows in the opposite direction until the cathode node voltage reaches 0, and the current is 0 at a voltage of 0. Thereafter, as the cathode node voltage falls below 0, the photocurrent increases exponentially. At this point, variations in the V-I characteristics of the photodiode occur according to the value of N.

(Phototransistor in Solar Cell Mode)

Figure 4:
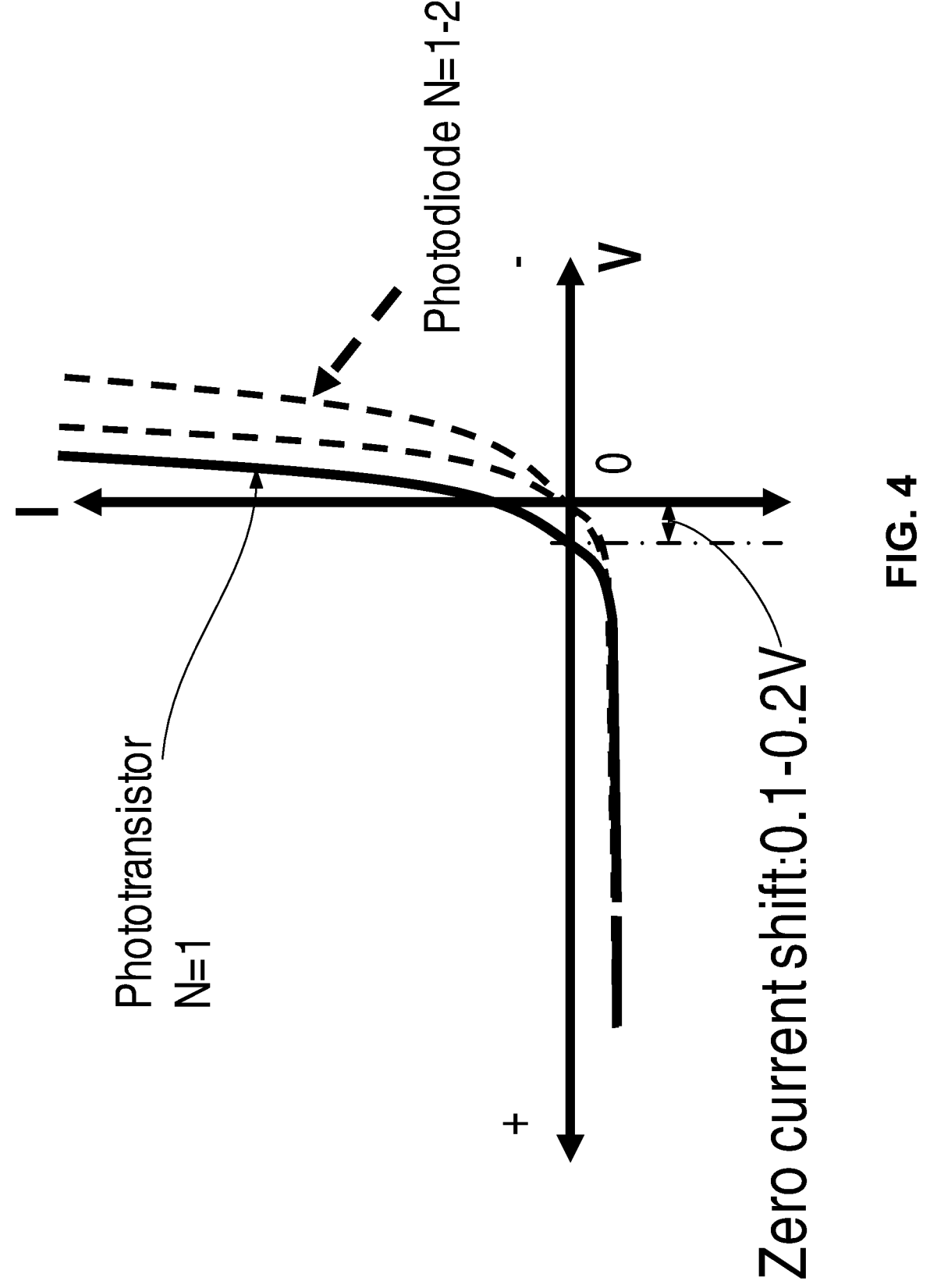
FIG. 4 is a graph illustrating the VI characteristics of a phototransistor and a photodiode according to an embodiment of the present disclosure.

FIG. 4 is a graph illustrating the V-I characteristics of the phototransistor 10 and a photodiode. The pinched-off state of phototransistor 10 is a state in which the gate voltage is sufficiently low (e.g., lower than the bias voltage to drain 102), the characteristics are similar to a photodiode operated in the state of a high source voltage, but a drain current begins to flow before the source voltage reaches 0V, the current is 0 ampere when the source voltage is between 0.1-0.2 V, and thereafter the drain current increases exponentially as the source voltage goes to increasingly negative values. In other words, phototransistor 10 in the pinched-off state operates in a solar cell mode similarly to a photodiode with a p-n junction formed between source 104 of phototransistor 10 and the semiconductor substrate 100 as illustrated in FIG. 2.

Referred back to FIG. 2, which illustrates the movement of photo-carriers (in this example, electrons) when operating in the solar cell mode. In this way, electrons generated by photoelectric conversion in the semiconductor substrate 100 in response to amount of incident light 20 received, flow into source 104 of phototransistor 10. Additionally, the electrons flow into drain 102 through the non-depleted bulk channel region separated from the pinched-off interface. In other words, a subthreshold current or an off-leakage current flows through the bulk channel region 106B. Note that as previously described, the presence of blocking layer 108 blocks the electrons generated inside the semiconductor substrate 100 from flowing into drain 102 directly.

Additionally, as illustrated in FIG. 4, there is no variation or change in the subthreshold current of the phototransistor 10 in the pinched-off state when the emission coefficient N=1. Output variations are thought to be suppressed because the subthreshold current is independent of carrier recombination due to surface defects.

At this point, when the diffusion length L of the photo-carriers (in this case, electrons) in the non-depleted bulk channel region is longer than the distance between source 104 and drain 102, the photo-carriers flow into the drain 102 through the non-depleted bulk channel region.

The diffusion length L is approximately from 1 μm to 100 μm depending on the crystallinity of the bulk channel region in the semiconductor substrate 100. Since it is sufficiently longer than the length between the miniaturized source (e.g., source 104) and drain (e.g., drain 102), the subthreshold current does not disappear in the bulk channel region (e.g., bulk channel region 106B). On the other hand, when a lateral distance between the source (e.g., source 104) and the drain (e.g., drain 102) is shorter than the depth of the bulk channel (e.g., channel 106), the emission coefficient N becomes larger than 1 due to the short channel effect, causing variations in the V-I characteristics. In the present embodiment, the phototransistor 10 is configured such that an appropriate distance between source (e.g., source 104) and drain (e.g., drain 102) is obtained.

(Integration Circuit 12)

Figure 5:
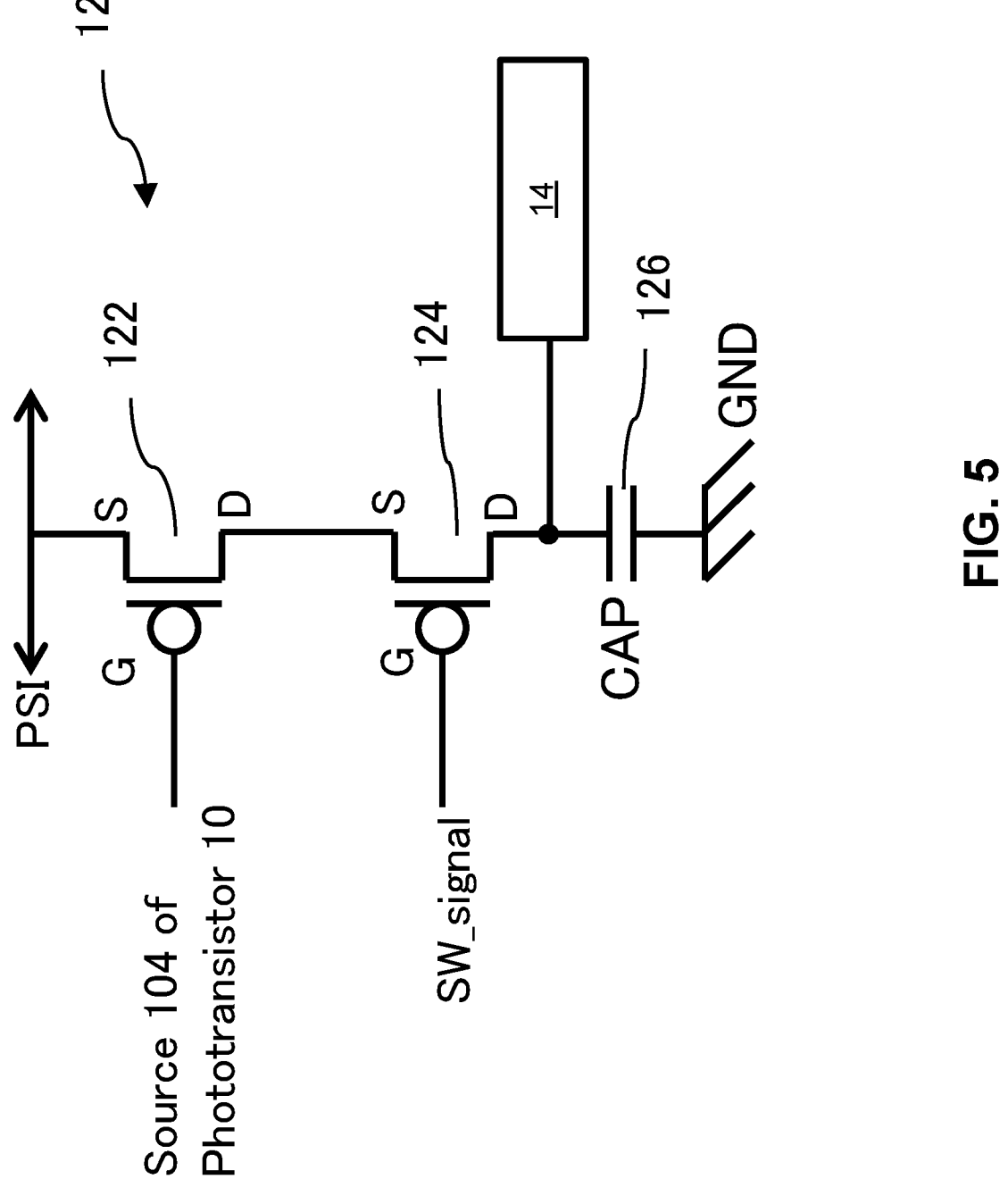
FIG. 5 illustrates a configuration of an example of an integration circuit using a p-channel FET according to an embodiment of the present disclosure.

FIG. 5 illustrates an example circuitry configuration of an integration circuit 12 using a p-channel FET. The integration circuit 12 includes a p-channel transistor 122, a switch transistor 124, and an integrating capacitor 126. A source of p-channel transistor 122 is connected to a power source PSI. A source of switch transistor 124 is connected to a drain of the p-channel transistor 122. The integrating capacitor 126 connected to the drain of the switch transistor 124. In the embodiments, the p-channel transistor 122 and switch transistor 124 are both p-channel FETs.

The gate of p-channel transistor 122 is connected to the source of the phototransistor 10, and allows the flow of a current according to a source voltage of the phototransistor 10 outputted. In other words, a current corresponding to the amount of incident light 20 that is incident on the phototransistor 10 flows from p-channel transistor 122. A signal SW_sig is supplied to the gate of switch transistor 124. The signal SW_sig may be configured and outputted by a control circuit (not illustrated) in an image sensor. The signal SW_sig operatively turns off when the voltage of the integrating capacitor 126 is read out.

(Operations of Pixel Circuit)

Figure 6:
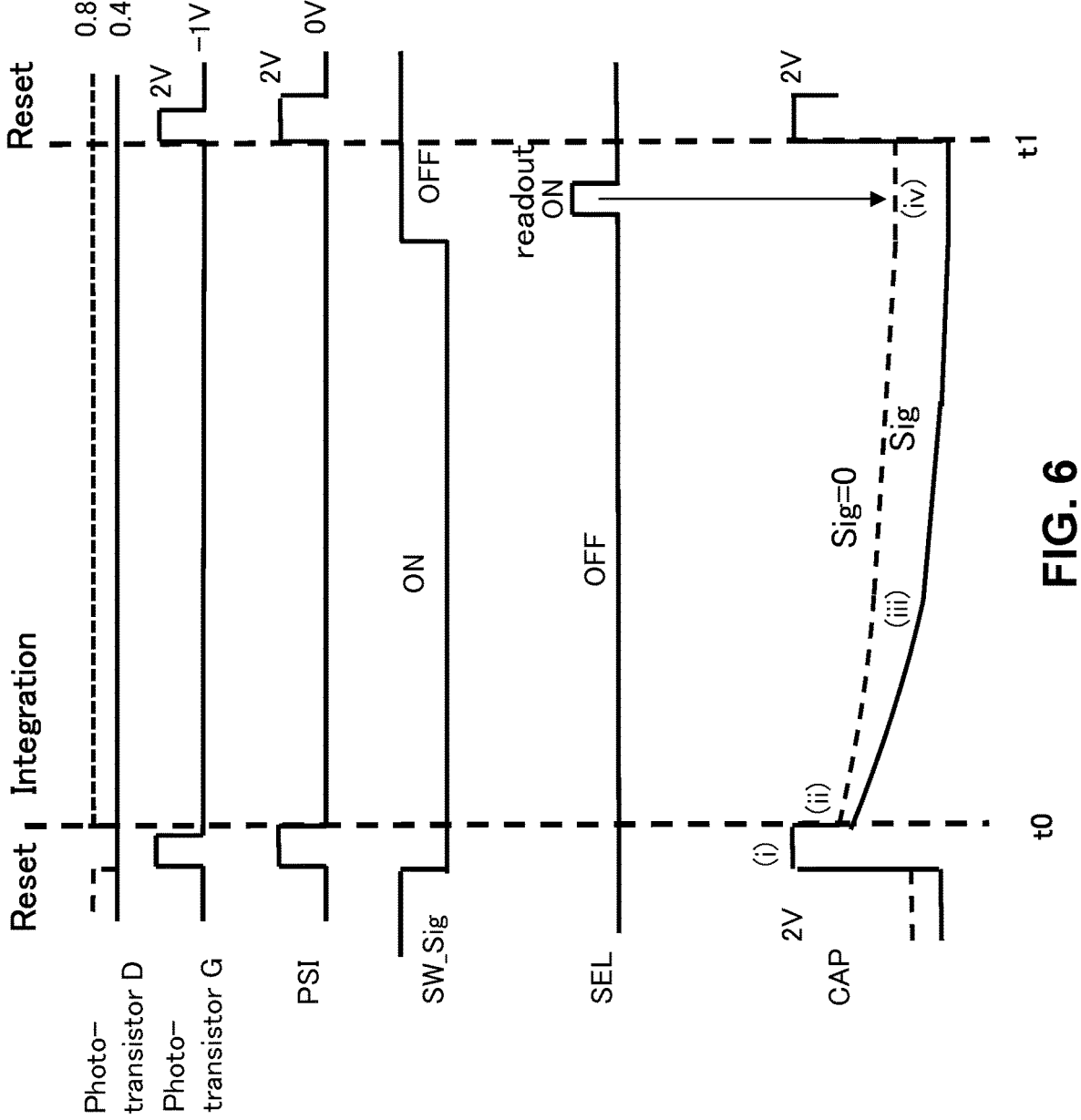
FIG. 6 is a timing chart illustrating operations of a phototransistor, an integration circuit, and an output circuit according to an embodiment of the present disclosure.
Figure 7:
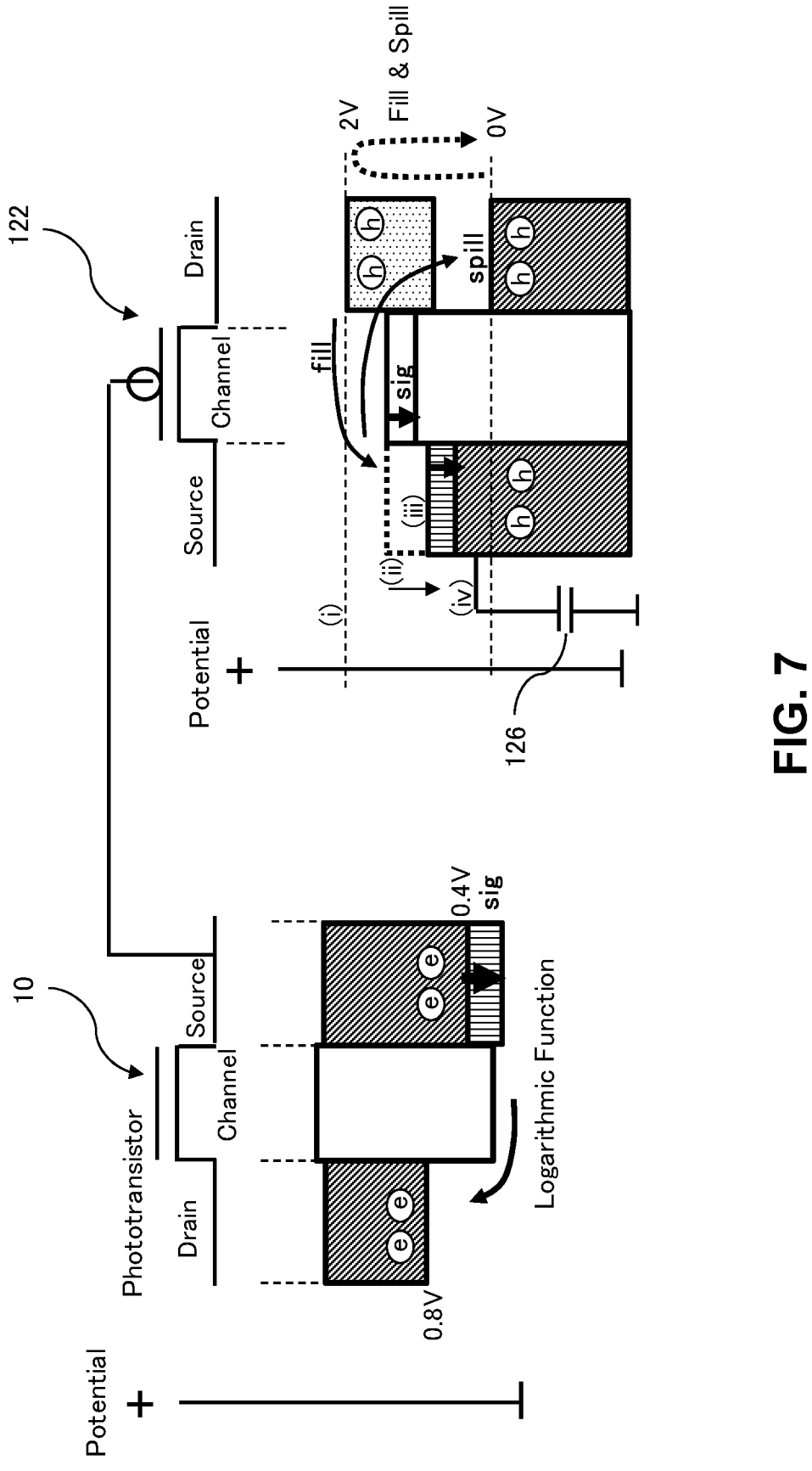
FIG. 7 is an explanatory diagram illustrating the potential of each part of a phototransistor and a p-channel transistor according to an embodiment of the present disclosure.

FIG. 6 is a timing chart illustrating exemplary operations of the pixel circuit. Please refer to FIG. 6 in view of FIG. 2 and FIG. 7. FIG. 7 shows a diagram illustrating an exemplary potential configuration of each part of a phototransistor and a p-channel transistor according to an embodiment of the present disclosure.

As illustrated in FIG. 6, drain 102 (labeled D in the chart) of the phototransistor 10 may be set to a constant positive biasing voltage. For example, a constant voltage of 0.4V is applied to the drain 102 through drain contact 112. It is appreciated that, as illustrated by the dashed line in the chart, drain 102 may also be set to 0.4 V only during the reset period, and set to 0.8 V otherwise in some embodiments.

The gate electrode 116 (labeled G in the chart) is biased by a control signal that turns on phototransistor 10 as a high level in a reset period before the integration of the amount of incident light (e.g., incident light 20) is started (e.g., before time t0). With this configuration, source 104 is first reset to the same voltage (e.g., 0.4 V) as drain 102. In addition, a control voltage applied to the gate electrode 116 (labeled G in the chart) via the control signal is set to a negative voltage level (e.g., −1 V or other negative voltage level that turns off phototransistor 10 depending on the associated electrical characteristic of phototransistor 10). With this configuration, the phototransistor 10 is turned off completely and enters a pinched-off state. It is appreciated that the voltage level of the control signal applied to gate electrode 116 and the bias voltage applied to drain 102 may be configured to other suitable voltage level that enables the flow of subthreshold current providing electron movement path from source 104 to drain 106 during integration period when the phototransistor 10 operates in pinch-off state.

In the pinched-off state, electrons generated in response to an amount of light (e.g., incident light 20 of FIG. 2) incident on the phototransistor 10 (e.g., through second surface 100*b* or illuminated surface of the semiconductor substrate 100) enter the source region from the p-n junction, causing source voltage at the source 104 falls. As illustrated on the left side of FIG. 7, the introduction of electrons into the source 104 causes changes in source of voltage and a corresponding voltage signal Sig to be generated, and the potential falls from the preset voltage (e.g., 0.4 V).

Here, drain 102 as illustrated may be configured at 0.4 V (or 0.8 V) depending operation needs, causing electrons move from the lower-voltage source 104 toward the drain 102. This movement of electrons is a subthreshold current or off-leakage current, and is the current described above that changes exponentially depending on amount of photo-carriers 120 generated in response to the incident light 20. For this reason, the source voltage changes logarithmically with respect to the movement of the electrons generated by photoelectric conversion.

The gate of the p-channel transistor 122 is connected to the source 104 of the phototransistor 10.

Next, integration operations will be described. Since FIGS. 6 and 7 illustrate the timings in four stages from (i) to (iv), each stage will be described.

(i) In operation, the power source PSI of integration circuit 12, is configured to briefly goes to H level (for example, 2 V) at the reset period (e.g., before time t0). At this time, phototransistor 10 is pulsed on via the control signal at gate electrode 116 (labeled G in the chart), the source of the phototransistor 10 is thus at 0.4 V same as the voltage of drain 102. Then the p-channel transistor 122 is configured to turn on, and the potentials of the channel and source thereof also go to high with a voltage of 2 V. In other words, holes are supplied to the source of the p-channel transistor 122 to which the integrating capacitor 126 is connected from the drain thereof. Also, since the signal SW_sig is at L level and switch transistor 124 is also on, the integrating capacitor 126 is set to the voltage level (e.g., 2 V) supplied by the power source PSI.

(ii) Next, after time t0, the power source PSI returns to 0 V, which causes the drain of p-channel transistor 122 to return to 0 V, the source voltage of the source of the p-channel transistor 122 to go to a voltage corresponding to the gate voltage, and corresponding holes from the source of the p-channel transistor 122 to return to the drain of the p-channel transistor 122.

In other words, a fill & spill operation of the drain of the p-channel transistor 122 causes the voltage of integrating capacitor 126 to be set to a voltage corresponding to the source voltage (e.g., voltage at source 104) of phototransistor 10.

(iii) The source voltage (e.g., the voltage signal Sig) of phototransistor 10 decreases logarithmically from 0.4 V with respect to the amount of incident light due to the inflow of photo-carriers and the subthreshold current during the integration period (i.e., between time t0 and t1). In the illustrated embodiment, the voltage change at the source 104 of phototransistor 10 corresponds to the voltage signal Sig illustrated in FIG. 6. Additionally, the source voltage of p-channel transistor 122 changes according to the source voltage of phototransistor 10, and the current thereof is integrated by the integrating capacitor 126. Consequently, the voltage of the integrating capacitor 126 decreases in correspondence with voltage changes in the voltage signal Sig.

(iv) After a prescribed integration period elapses, the signal SW_sig goes to H level, and the switch transistor 124 turns off. In addition, the row-select signal SEL going to H level causes the row-select transistor 14*b* to turn on, and an output signal (e.g., image signal) according to the voltage of integrating capacitor 126 is outputted from the output line 18. In this way, an output signal corresponding to the amount of incident light on a detection or a sensing region of the phototransistor 10 of a respective pixel is obtained. It is appreciated that the control signal applied to the gate electrode 116 of the phototransistor 10, the voltage applied to drain 102, the signal SW_sig to switch transistor 124, and the voltage level of the power source PSI may be configured by a control circuit included in the image sensor (not illustrated), wherein the control circuit is coupled to phototransistor 10 and integration circuit 12.

In this way, in the present embodiment, by operating the phototransistor 10 in the pinched-off state, the phototransistor 10 is configured to operate in the solar cell mode. Consequently, the dynamic range can be expanded.

Also, the integration circuit 12 is coupled between source 104 of the phototransistor 10 and source-follower transistor 14a as illustrated in FIG. 1. Consequently, the signal change in response to the amount of incident light on phototransistor 10, which operates in the solar cell mode, is integrated and outputted. For this reason, the flicker that occurs when capturing an LED or the like can be suppressed.

It is appreciated that in the example described above, an n-channel FET is used in the phototransistor 10 and a p-channel FET is used in the integration circuit, but it is also possible to use a p-channel FET in the phototransistor and an n-channel FET in the integration circuit 12 in other embodiments.

(Other Example of Integration Circuit)

Figure 8:
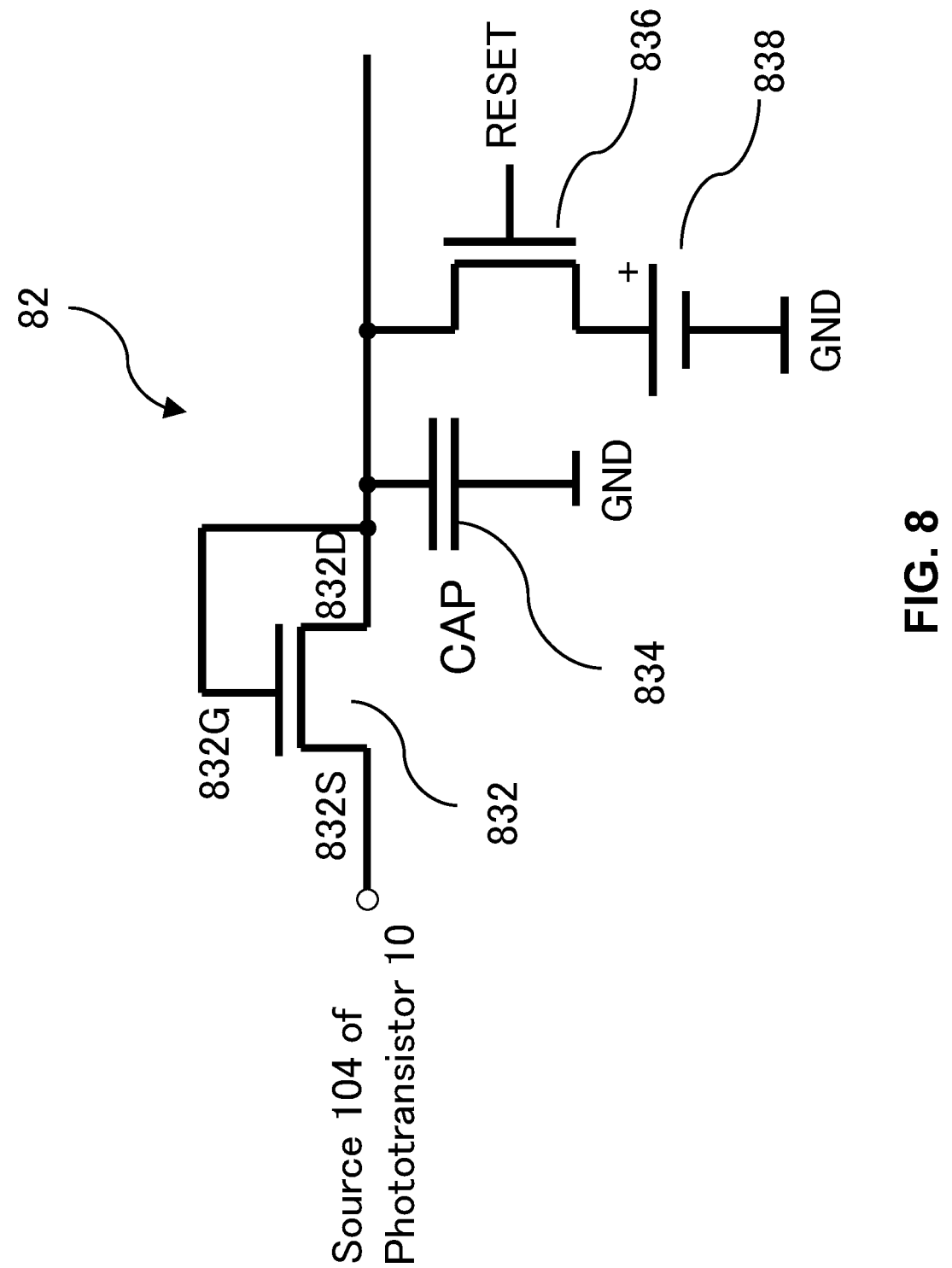
FIG. 8 illustrates a configuration of an example of an integration circuit using an n-channel FET according to an embodiment of the present disclosure.

FIG. 8 illustrates a configuration of another example of an integration circuit 82 using an n-channel FET. The integration circuit 82 includes an n-channel transistor 832, an integrating capacitor 834 connected to a drain 832D of the n-channel transistor 832, a reset transistor 836 connected in parallel with the integrating capacitor 834, and a reset power source 838 coupled between reset transistor 836 and a ground GND. The n-channel transistor 832 is configured as a diode-connected n-channel transistor that has a gate 832G thereof electrically connected to the drain 832D thereof. The n-channel transistor 832 and reset transistor 836 are both n-channel FETs. The reset transistor 836 is coupled to receive a signal RESET and configured to charge and discharge upon receiving the signal RESET.

At the reset timing, the reset transistor 836 turns on (e.g., coupled to receive a signal RESET with high voltage level) and the integrating capacitor 834 is charged to the voltage (for example, 2 V) of the reset power source 838.

A source 832S of the n-channel transistor 832 may be connected to the source 104 of the phototransistor 10, for example via source contact 112, and allows the flow of a current according to the source voltage of the phototransistor 10. In other words, a current corresponding to the amount of incident light on the phototransistor 10 flows from the integrating capacitor 834 to the source 104 of the phototransistor 10 and is integrated in the negative direction in the integrating capacitor 834. Consequently, a voltage similar to the integrating capacitor 126 of the circuit in FIG. 5 is obtained in the integrating capacitor 834.

(Modification of Phototransistor 10)

Figure 9:
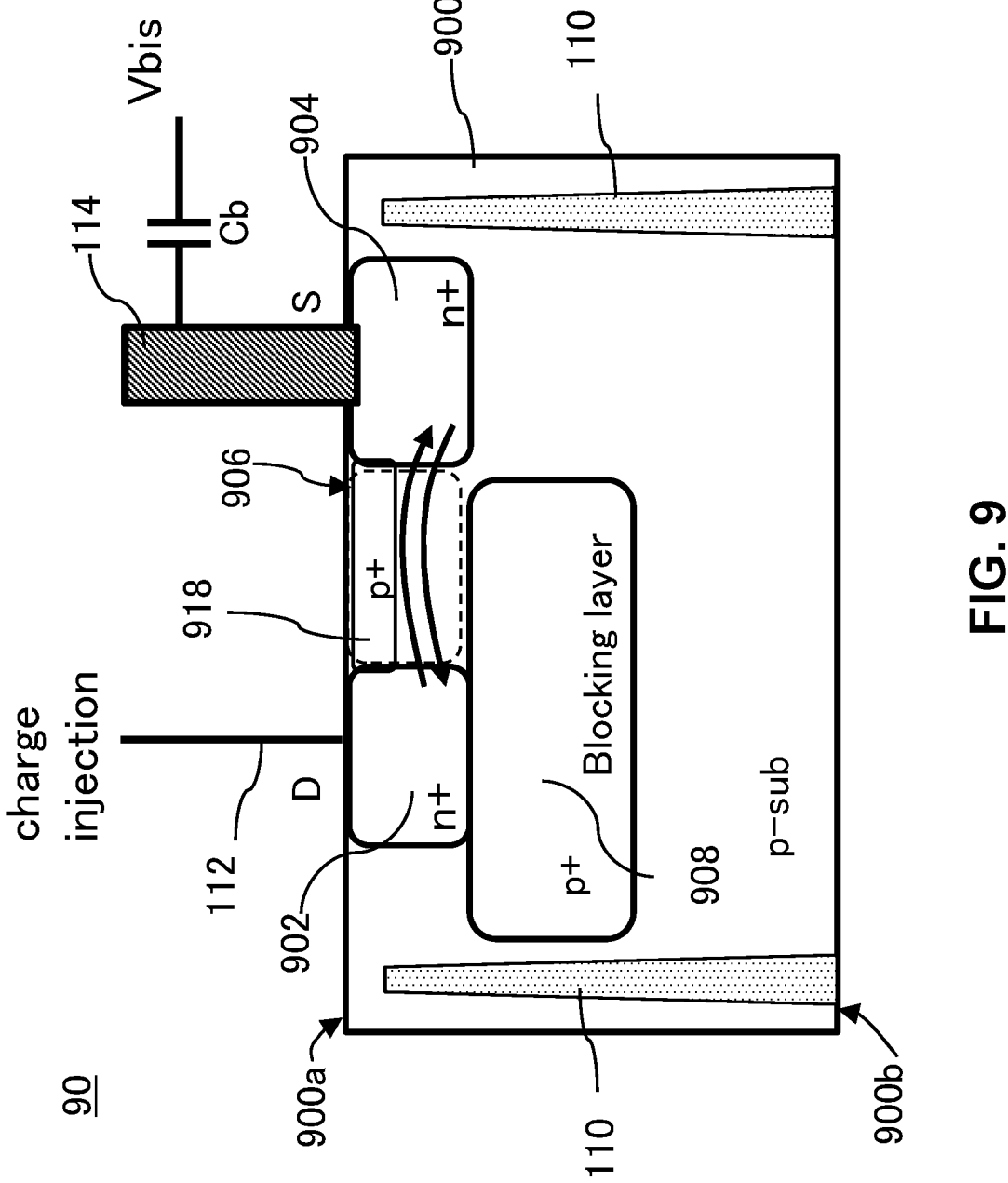
FIG. 9 illustrates a modification of a phototransistor according to an embodiment of the present disclosure.

FIG. 9 illustrates a partial cross-sectional view showing an alternative configuration of a phototransistor 90. The phototransistor 90 is a modification of phototransistor 10, and may include the same or similar features, elements, and the like as phototransistor 10. In the embodiment illustrated in FIG. 9, phototransistor 90 does not include a gate electrode. Instead, a surface blocking layer 918 is provided in a surface part of the channel 906. That is, phototransistor 90 includes a drain 902, a source 904, surface blocking layer 918, and a blocking layer 908. The surface blocking layer 918 is disposed proximate to first surface 900a between drain 902 and source 904 preventing generated photo-carriers from moving toward to first surface 900a. In one embodiment, the surface blocking layer 918 is doped to generate electrical field that pushes one or more generated photo-carriers (e.g., electron) away from the surface part of channel 906 in close proximity to first surface 900a.

The phototransistor 90 is disposed on a semiconductor substrate 900, which may be an example of semiconductor substrate 100. The semiconductor substrate 900 may be a silicon substrate, a silicon germanium alloy, germanium, a silicon carbide alloy, an indium gallium arsenide alloy, any other alloys formed of III-V compounds, other suitable semiconductor materials or alloys, combinations thereof, a bulk substrate thereof, or a wafer thereof. In some embodiments, semiconductor substrate 900 may also be formed as an epitaxial substrate. In some embodiments, semiconductor substrate 900 may a substrate having at least a semiconductor layer that is epitaxially grown thereon where phototransistor 10 is formed therein. In embodiments, the semiconductor substrate 900 may include at least a semiconductor layer e.g., doped epitaxial layer. In illustrated embodiments, the drain 902, source 904, and blocking layer 908 are formed or otherwise disposed in the semiconductor layer. The semiconductor substrate 900 may have a first surface 900a and a second surface 900b opposite to first surface 900a.

Source 904 and drain 902, each may be example of source 104, and drain 102, respectively. In embodiments, the source 904 and the drain 902 are doped regions formed via ion implantation or otherwise disposed in the semiconductor substrate 900, each having opposite type of conductivity to the semiconductor substrate 900. In the example, source 904 and drain 902 are doped regions doped with a high concentration of n-type impurities. The blocking layer 908 is an example of blocking layer 108.

The blocking layer 908 is a doped region having conductivity type opposite to each of source 904 and drain 902. In one embodiment, blocking layer 908 is a region of the semiconductor substrate 900 doped with a high concentration of p-type impurities. The blocking layer 908 is disposed between drain 902 and second surface 900b.

The phototransistor 90 is configured to operate in pinched-off state during an exposure or integration period, such that in operation, one or more photo-carriers (e.g., electron) generated in the semiconductor substrate 900 in response to light incident on phototransistor 90 through the second surface 900b flow from the source 904 through a bulk channel region of the channel 906 into drain 902 via subthreshold current. The bulk channel region of the channel 906 is configured to be formed between the surface blocking layer 918 and the blocking layer 908. The blocking layer 908 is configured to prevent the one or more photo-carriers (e.g., electron) generated in semiconductor substrate 900 from directly entering drain 902 and absorbed by drain 902. That is, the blocking layer 908 may operatively prevent the one or more photo-carriers (e.g., electron) generated in the semiconductor substrate 900 from entering the drain 902 without passing through the source 904 in a similar manner as blocking layer 108.

Also, a bias power source Vbis that reverse-swings the voltage at the source 904 is connected to the source contact 114 through a bias capacitor Cb.

Figure 10:
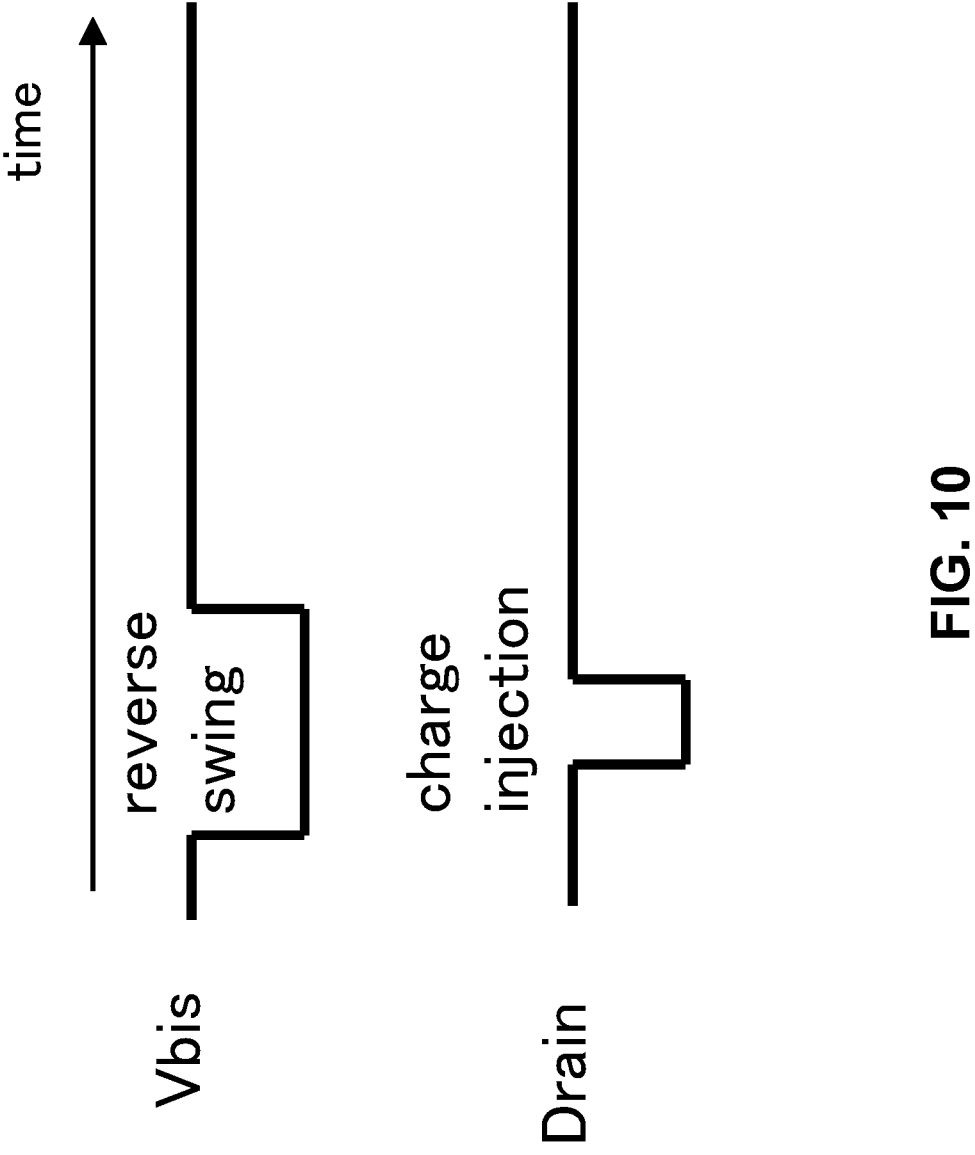
FIG. 10 is an operation timing chart of a phototransistor according to the modification according to an embodiment of the present disclosure.

FIG. 10 is an exemplary operational timing diagram of the phototransistor 90 based to the modification according to the teaching of the present disclosure. In the phototransistor 10 of FIG. 2, the initial source voltage at the beginning of light sensing resets to the drain voltage by briefly turning on the gate. Since there is no gate electrode in the present modification in FIG. 9, charge is injected into source 904 by fill & spill operation from the drain 902 as indicated by arrows between source 904 and drain 902.

In the illustrated embodiment, the bias power source Vbis first configured to go from H level (e.g., 0.8 V) to L level (e.g., 0 V), and source 904 is set to L level (e.g., 0 V) through the bias capacitor Cb. In this state, a negative voltage (e.g., −0.4 V) is impressed on drain 902.

In this way, in the state where source 904 is at a higher voltage than the drain 902 of the phototransistor 90, a current flows from source 904 to drain 902, thereby causing electrons to be injected from drain 902 to source 904. Consequently, the voltage at source 904 is the same as voltage at the drain 902 (e.g., the voltage at source 904 also −0.4 V).

Next, after returning the voltage of drain 902 to a positive voltage (e.g., 0.4 V), the voltage of the bias capacitor Cb is returned to H level (e.g., 0.8 V). With this configuration, in an embodiment, the source voltage of the source 904 may be raised by 0.8 V from −0.4 V and set to 0.4 V.

In this way, both the source 904 and drain 902 are reset to a preset or predetermined reset voltage such as at 0.4 V to obtain an initial state after reset period prior to integration or exposure period. Such an operation of setting the source voltage of source 904 by setting the drain voltage of drain 902 is referred to as a drain fill & spill mode.

Thereafter, electrons flow into the source in response to incident light, and a portion of the electrons flows to the drain as a subthreshold current. Consequently, the amount of incident light can be detected in a way similar to the example described above.

(Example of Using Germanium (Ge) Substrate)

Figure 11:
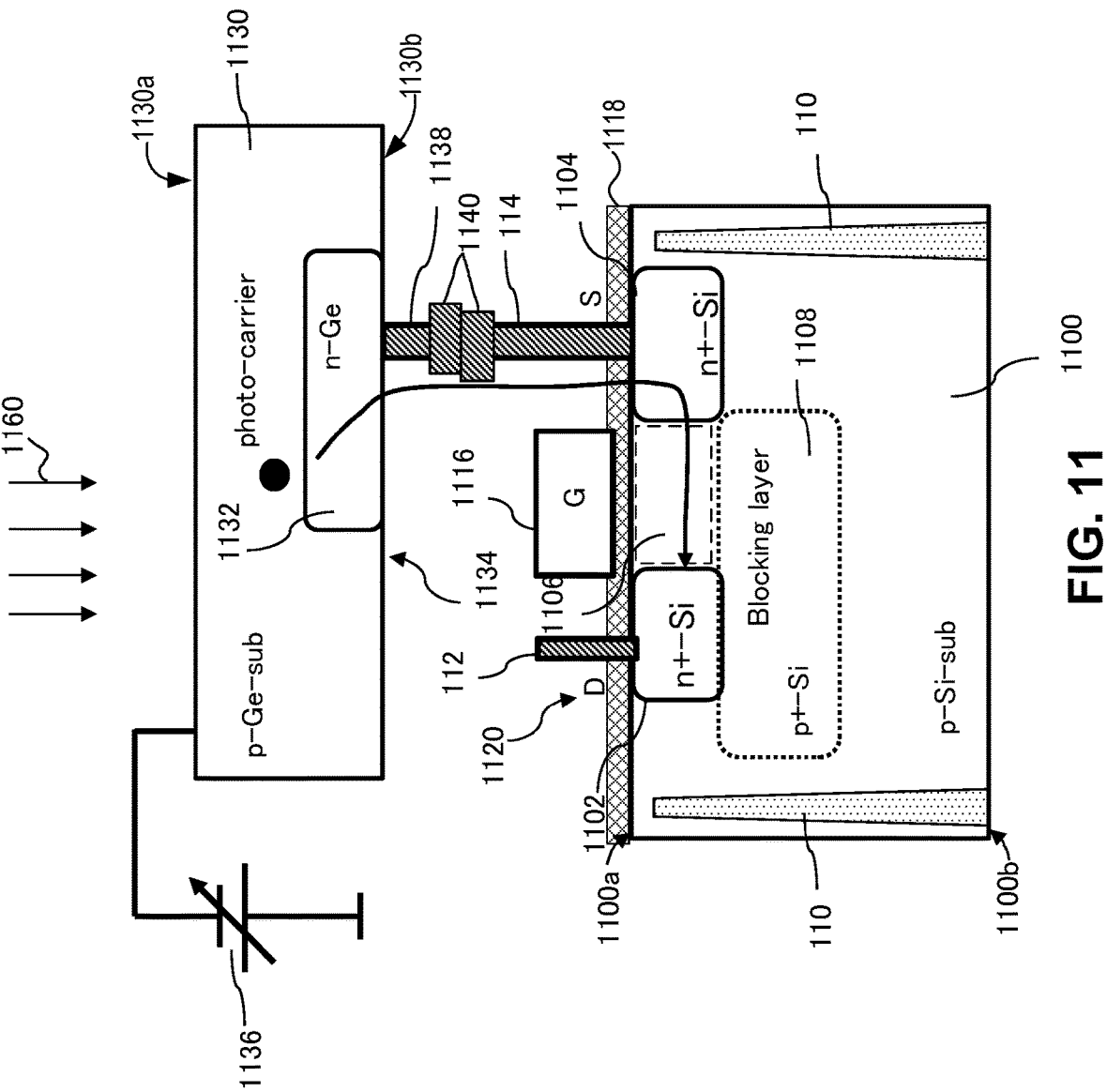
FIG. 11 is a cross-section view illustrating a configuration in which a germanium (Ge) substrate and a silicon substrate including a pinch-off transistor are provided separately according to an embodiment of the present disclosure.

FIG. 11 illustrate an example cross-section view of a pixel structure in according to the teaching of present disclosure. In the example illustrated in FIG. 11, a pixel includes a silicon substrate 1100 (first semiconductor substrate) and a germanium (Ge) substrate 1130 (second semiconductor substrate). The silicon substrate 1100 may be an example of semiconductor substrate 100, and has a first surface 1100a and a second surface 1100b opposite to the first surface 1100a. The germanium (Ge) substrate 1130 has a first substrate surface 1130a and a second substrate surface 1130b opposite to the first substrate surface 1130a. The silicon substrate 1100 is bonded with the germanium (Ge) substrate 1130 via suitable bonding scheme such as oxide-bonding, hybrid bonding, and the like. In some embodiments, the silicon substrate 1100 is bonded the germanium (Ge) substrate 1130 using a face to face (F-F) bonding scheme on a pixel-level basis. In some embodiments, a silicon germanium (SiGe) substrate may be used instead of Ge substrate 1130 depending imaging application. It is appreciated that certain elements may be omitted or unlabeled (e.g., contact to gate electrode 116, optical elements such as color filter, microlens, and metal layers for signal routing between the silicon substrate 1100 and Ge substrate 1130, and so on) to avoid obscuring certain aspects of the present embodiment provided according to the teaching of present disclosure.

The germanium (Ge) substrate 1130 includes an n-type doped region 1132 formed or otherwise disposed in the germanium substrate 1130 proximate to the second substrate surface 1130b. The n-type doped region 1132 is a doped region of the Ge substrate 1130. The silicon substrate 1100 includes a pinch-off transistor 1120. In various examples, the silicon substrate 1100 may be an epitaxial substrate. In various examples, the silicon substrate 1100 may include a semiconductor layer (e.g., an epitaxially grown silicon layer that has pinch-off transistor 1120 formed thereon). The germanium (Ge) substrate 1130 may be a substrate having a semiconductor layer (e.g., an epitaxial grown Ge layer that has n-type doped region 1132 formed therewithin). The pinch-off transistor 1120 includes a drain 1102, a source 1104, a gate electrode 1116, an optional blocking layer 1108 disposed in the silicon substrate 1100. In various examples, the pinched-off transistor 1120 may be configured to operate in a pinched-off state similar to that of the phototransistor 10.

The Ge substrate 1130 is denoted a germanium substrate (p-Ge-sub) which is a p-type Ge region, and the n-type doped region (n-Ge) 1132 is disposed in a surface part on one side thereof (e.g., proximate to the second substrate surface 1130b). The n-type region 1132 is formed in each pixel for example, by an ion implantation. In embodiments, a single photodiode 1134 is a p-n junction formed by a single n-type region 1132 and a corresponding portion of the Ge substrate 1130. The photodiode 1134 is capable of detecting infrared light (e.g., light with wavelength that range from 850 nm to 3000 nm). The n-type region 1132 may be disposed in correspondence to the position arrangement of pinched-off transistor 1120 on the silicon substrate 1100. The Ge substrate 1130 is connected to a power source 1136 and set to an appropriate voltage. Also, wiring 1138 is electrically connected n-type region 1132 of the Ge substrate 1130 and to source 1104 of the pinched-off transistor 1120.

In an example embodiment, n-type region 1132 of Ge substrate 1130 and source 1104 of the pinched-off transistor 1120 are electrically connected via pixel-level hybrid bonding method through metal pads 1140 and wiring 1138 such that photo-carriers generated and accumulated in the n-type region 1132 transfers to source 1104, which is then move to drain 1102 through a bulk channel region of channel 1106 via subthreshold current.

When light 1160 is incident on the Ge substrate 1130, holes and electrons are generated. The holes flow to the power source 1136 while the electrons flow into the n-type region 1132.

In the silicon substrate 1100, pinch-off transistor 1120 is provided for each pixel that is included in a pixel array of an image sensor. The silicon substrate 1100 is p-type, and the phototransistor 1120 is a MOSFET similar to the phototransistor 10. In a surface part of the silicon substrate 1100, a first n+ doped region for source 1104 and a second n+ doped region for drain 1102 are formed a prescribed distance apart, and the region interposed in between is the channel 1106 configuring for coupling the source 1104 to drain 1102 during the operation of the pinched-off transistor 1120.

The blocking layer 1108 may be formed of a p-type doped region that is arranged cover the underside of the drain 1102 and the channel 1106 in silicon substrate 1100. Inside the silicon substrate 1100, the region of the phototransistor 1120 is isolated from the regions of the pinch-off transistors 1120 of adjacent pixels by corresponding pixel isolation portions 110.

The source contact 114 is connected to the surface of the source 1104, and the gate electrode 1116 is disposed on proximate to the surface of the channel 106 through a gate oxide film 1118. In addition, the wiring 1138 and the source contact 114 are connected to form a charge transfer path from the n-type region 1132 of the Ge substrate 1130 to the source 1104 of pinched-off transistor 1120.

Incident light causes the photo-carriers (electrons) generated during photoelectric conversion operation in the Ge substrate 1130 to flow through the wiring 1138 and the non-depleted bulk channel region of the phototransistor 1120 to the drain 1102. The non-depleted bulk channel region of the pinched-off transistor 1120 is formed (i) between drain 1102 and source 1104 and (ii) between a pinched-off region of channel 1106 and blocking layer 1108 when the pinched-off transistor 1120 configured to operate in a pinched-off state and drain 1102 is properly biased via drain contact 112.

In this case, the incident light (such as light 1160) often contains infrared rays that are in regime of near-infrared, infrared, short-wave infrared, far-infrared, and by using a Ge substrate 1130, efficient photoelectric conversion is performed. Moreover, it is appreciated that since Ge and Si have different physical constants such as the band gap, adjustment of the voltages of the Ge substrate 1130 and the silicon substrate 1110 is necessary. Accordingly, the voltage of the Ge substrate 1130 is adjusted by the power source 1136 to a more negative voltage than the voltage (e.g., zero volt or ground reference voltage) of the silicon substrate 1100. When a large negative voltage is impressed on the Ge substrate 1130, the photocurrent flows more easily but the dark current in the Ge substrate 1130 increases. Accordingly, the Ge substrate 1130 is preferably adjusted to be highly sensitive to incident light with a small dark current. For the power source 1136, in an example, which provides a voltage ranging approximately from $-0.2$ V to $-0.5$ V is thought to be appropriate in according to the teaching of present disclosure. However, it is appreciated that this range of voltage value may be applied only for the case where there are few crystal defects, and in actuality, there is a possibility that the value may deviate greatly or even be a positive voltage.

When using such photodiode 1134 and pinched-off transistor 1120, a signal (e.g., image signal) may be outputted from an output circuit (e.g., output circuit 14) through an integration circuit (e.g., integration circuit 12) coupled to source 1104, and these circuits may have the same implementation as the case described above.

Although in the illustrated embodiment, the silicon substrate 110 includes the blocking layer 1108, however, it is appreciated that when the photodiode and the transistor are formed on different substrates, the blocking layer can be omitted. That is, the blocking layer may be optional as denoted by dashline box. For example, in the illustrated embodiments, the photodiode 1134 is disposed on the Ge substrate 1130 and the pinch-off transistor 1120 is disposed on the silicon substrate 1100 as such no photoelectric conversion occur within the silicon substrate 110. In such embodiment, the blocking layer 1108 may be omitted from the silicon substrate 1100.

(Forming Ge Photodiode Inside Substrate)

In FIG. 11, the Ge substrate 1130 and the silicon substrate 1100 are created separately and bonded together in a stacking manner, but another possibility is to form a heterogeneous bonding of Si and Ge, and create a Ge-based photodiode 1134 and a Si-based phototransistor 1120 inside a single substrate.

FIG. 12A illustrates a configuration of a pixel having a pinched-off transistor for sensing infrared light (e.g., light with wavelength that range from 850 nm to 3000 nm) according to the teaching of the present disclosure. FIG. 12A illustrates a configuration in which a Ge photodiode 1234A is embedded or otherwise disposed in an n-type doped diffusion layer 1250 coupled to a source 1204 of a pinched-off transistor 1220. The n-type doped diffusion layer 1250 may be a silicon doped region that is disposed within a semiconductor substrate 1200 (e.g., p-type doped silicon substrate, epitaxial substrate, or the like), wherein the semiconductor substrate 1200 has a first surface 1200*a* and a second surface 1200*b* opposite to the first surface 1200*a*. The Ge photodiode 1234A may comprise of a p-n junction formed of a Ge p-type region Ge (p) and a Ge n-type region Ge (n). The p-n junction formed of Ge p-type region Ge (p) and Ge n-type region Ge (n) is within the n-type doped diffusion layer 1250. Ge photodiode 1234A is disposed proximate to the first surface 1200*a* of semiconductor substrate 1200.

The pinched-off transistor 1220 includes a drain 1202, a source 1204, a gate electrode 1216 and a blocking layer 1208 formed in the semiconductor substrate 1200. The pinched-off transistor 1220 is disposed proximate to the first surface 1200*a* of the semiconductor substrate 1200. The pinched-off transistor 1220 may include drain 1202, a source 1204, a gate electrode 1216 and a blocking layer 1208. It is appreciated that, drain 1202, source 1204, gate electrode 1216, and blocking layer 1208 may be configured in a similar manner as drain 102, a source 104, a gate electrode 116 and a blocking layer 108 of phototransistor 10 of FIG. 2, respectively. The blocking layer 1208 is disposed in the semiconductor substrate 120 covering the underside region of drain 1202 and channel 1206. The drain 1202 and source 1204 having opposite conductive type as the blocking layer are heavily doped region e.g., N+ doped regions. The drain 1202 is coupled to constantly receive a bias voltage. In embodiments, source 1204 is configured to extend and partially embedded in the n-type doped diffusion layer 1250 to electrically couple to the Ge photodiode 1234A.

In operation, during an integration or exposure period of the pixel, the pinched-off transistor 1220 is configured to operate a pinched-off state. That is, the drain 1202 is coupled to constantly receive the bias voltage being greater than a voltage (e.g., zero or ground reference voltage) applied to gate electrode 1216. In such operation, photo-carriers are generated by Ge photodiode 1234A in the semiconductor substrate 1200 in response to incident light (e.g., light 1240) incident on second surface 1200*b* and accumulated in the n-type region 1132 transfers to source 1104, which is then move to drain 1102 through a bulk channel region of channel 1206 via a flow of subthreshold current.

FIG. 12B illustrates another example configuration of a pixel having a pinched-off transistor for sensing infrared light according to the teaching of the present disclosure. FIG. 12B is similar to FIG. 12A with difference on the position of Ge photodiode 1234B. FIG. 12B illustrates a configuration in which a Ge photodiode 1234B is formed in an upper part of the n-type doped diffusion layer 1250. The Ge photodiode 1234B may be coupled to the source 1204 of pinched-off transistor 1220 through n-type doped diffusion layer 1250. Ge photodiode 1234B is formed on the first surface 1200*a* of semiconductor substrate 1200. In one example, Ge photodiode 1234B may be formed by Ge-in-situ doped epitaxial layer grown on the first surface 1200*a* of semiconductor substrate 1200.

FIG. 12C illustrates another example configuration of a pixel having a pinched-off transistor for sensing infrared light according to the teaching of the present disclosure, FIG. 12C illustrates a configuration in which the Ge photodiode 1234C is bonded to the second surface 1200*b* (e.g., rear-surface side) of the semiconductor substrate 1200. The Ge photodiode 1234C may be coupled to the source 1204 of pinched-off transistor 1220 through n-type doped diffusion layer 1250. In one example, Ge photodiode 1234C may be formed in another substrate (e.g., germanium substrate or silicon germanium substrate) and bonded to second surface 1200*b* of the semiconductor substrate 1200.

Pixel with such configurations using pinched-off transistor 1220 similar to phototransistor 10, operations similar to FIG. 10 can also be expected.

[Image Sensor]

FIG. 13 is a block diagram showing a structure of an image sensor according to an embodiment of the present disclosure. An image sensor 1300 of this example configuration comprises a pixel array 1310 having a plurality of pixels P, a readout circuitry 1314, and a function logic 1316. Each pixel P includes a pixel circuit that has correspond to configurations illustrated in FIG. 1, FIG. 2, FIG. 11, and FIG. 12A-12C with operation further described in FIG. 6, FIG. 7 and FIG. 10 in accordance with embodiments of the present disclosure.

The pixel array 1310 is a two-dimensional array in which pixels P are arranged in rows and columns. In some embodiments, each pixel P may employ a phototransistor such as phototransistor 10. In some embodiments, each pixel P may employ a pinched-off transistor such as pinched-off transistor 1120, or pinched-off transistor 1220 that is coupled to a Si-based photodiode or Ge-based photodiode to generate a corresponding image signal in response to incident light sensed or otherwise detected in a manner as above described.

Image sensor 1300 is a simplified schematic showing a pixel array 1310 with a plurality of pixels P, each including at least one of the photodiodes disposed within respective pixel regions in the pixel array 1310.

Each pixel P may have a color filter on a light incidence side, and light of a particular color which has passed through the color filter is incident on the pixel P.

A control circuitry 1312 controls operations (e.g., during pre-, post-, and in situ phases of image and/or video acquisition) of the pixel array 1310. For example, the control circuitry 1312 controls an exposure period of each pixel P, an output of the image signal of each pixel P, or the like. The control circuitry 1312 may control the operation of the phototransistor (or the pinched-off transistor) used in each pixel in according to the operation of image sensor 1300. The control circuitry 1312 can be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic.

The readout circuitry 1314 individually reads out the image signal of each pixel P, A/D converts the read signal to acquire digital data, and supplies the digital data to the function logic 1316. For example, the readout circuitry 1314 reads or otherwise samples the analog signal from the individual pixels (e.g., read out voltage signals generated by each of the plurality of pixels) in the pixel array 1310 in response to incident light to generate image signals for capturing an image frame, and the like and can include amplification circuitry, analog-to-digital (ADC) circuitry, image buffers, or otherwise. In the illustrated embodiments, readout circuitry 1314 is separate from the control circuit 1312, but in other embodiments, readout circuitry 1314 may be included in control circuitry 1312.

The function logic 1316 is coupled to the readout circuitry 1314 to receive image data to de-mosaic the image data and generate one or more image frames. In example embodiments, function logic 1316 applies processes (e.g., apply post image effects such as crop, rotate, remove red eye, adjust brightness, adjust contrast, or otherwise) on the data from each pixel P, to acquire a video signal for screen display, and outputs the acquired video signal. The video signal is supplied to a display or other electronic devices, and an image acquired by the image sensor 1300 may be displayed on the display.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit of an image sensor, the pixel circuit comprising:
   a transistor including a first doped region and a second doped region, the first and second doped regions disposed on opposite sides of a channel of the transistor proximate to a first surface of a semiconductor substrate such that photo-carriers generated inside the semiconductor substrate in response to an incident light flow into the second doped region, and the first doped region coupled to output a voltage signal;
   a blocking layer disposed in the semiconductor substrate between the second doped region and a second surface of the semiconductor substrate opposite to the first surface, and the blocking layer blocking the photo-carriers from flowing into the second doped region directly; and
   an output circuit coupled to the transistor and configured to output an image signal according to the voltage signal,
   wherein the transistor is configured to allow a flow of a subthreshold current between the first doped region and the second doped region while operating in a pinched-off state in which photo-carriers are configured to pass through a bulk channel region of the channel located at a position apart from the first surface of the semiconductor substrate;
   wherein the blocking layer overlap at least in part with the second doped region and lateral extends to be in a direct contact with the first doped region.

2. The pixel circuit according to claim 1, wherein the blocking layer has a conductivity type that is opposite to a conductivity type of the second doped region.

3. The pixel circuit according to claim 1, wherein the blocking layer is disposed such that the channel of the transistor is between the gate electrode of the transistor and the blocking layer.

4. The pixel circuit according to claim 1, further comprising a gate electrode disposed to couple the first doped region to the second doped region, wherein the second doped region is constantly coupled to receive a bias voltage, and the gate electrode is coupled to receive a control voltage that is less than the bias voltage.

5. The pixel circuit according to claim 4, wherein the transistor is a phototransistor comprising of an n-channel field-effect transistor, and the first doped region is a source of the phototransistor and the second doped region is a drain of the phototransistor.

6. The pixel circuit according to claim 4, wherein the photo-carriers are generated inside in a p-n junction formed between the first doped region and a substrate region of the semiconductor substrate surrounding the first doped region, and the transistor is configured such that the photo-carriers flow from the first doped region into the second doped region through the bulk channel region.

7. The pixel circuit according to claim 1, wherein the subthreshold current varies logarithmically to a number of photo-carriers generated in response to an incident light.

8. The pixel circuit according to claim 1, wherein the transistor comprises:

a surface blocking layer disposed in between the channel and the first surface, and between the first doped region and the second doped region, the surface blocking layer having a conductivity type opposite to a conductivity type of each of the first doped region and the second doped region; and a bias capacitor coupled between the first doped region and a bias power source.

9. The pixel circuit according to claim 1, wherein the integration circuit comprises:

a p-channel transistor having a gate thereof coupled to the first doped region of the transistor, and an integrating capacitor coupled to a source of the p-channel transistor.

10. The pixel circuit according to claim 1, wherein the integration circuit comprises:

an n-channel transistor having a drain and a gate thereof connected to one another and the n-channel transistor having a source thereof coupled to the first doped region of the transistor, and an integrating capacitor and a reset transistor coupled to the drain of the n-channel transistor.

11. The pixel circuit according to claim 1, further comprising:

a p-n junction in the semiconductor substrate coupled to the first doped region, the p-n junction including a p-type doped germanium (Ge) region and an n-type doped Ge region, the p-n junction configured to sense light wavelength greater than or equal to 850 nanometers, and generate photo-carriers in response to incident light.

12. The pixel circuit according to claim 11, further comprising a n-type doped diffusion layer disposed in the semiconductor substrate, the n-type doped diffusion layer is coupled to the first doped region, wherein the p-n junction is in the n-type doped diffusion region.

13. The pixel circuit according to claim 1, wherein the output circuit includes an integration circuit coupled to receive the voltage signal outputted from the transistor and integrates the voltage signal to generate the image signal.

14. An image sensor including a plurality of pixel circuits, each of the plurality of pixel circuits comprising:

a photodiode comprising of a p-type doped germanium (Ge) region and an n-type doped Ge region, the photodiode having a p-n junction sensitive to an infrared light, and generating photo-carriers in response to an incident light;

a pinched-off transistor disposed in a first semiconductor substrate, the pinched-off transistor is electrically coupled to the photodiode, and the pinched-off transistor comprising:

a source and a drain disposed on both sides of a channel proximate to a first surface of the first semiconductor substrate such that photo-carriers from the photodiode are received into one region of the source and the drain; and an output circuit disposed on the first semiconductor substrate and which outputs an image signal based on a voltage signal outputted from the one region of the source and the drain of the pinched-off transistor, wherein the pinched-off transistor allows a flow of a subthreshold current in a pinched-off state in which photo-carriers pass through a bulk channel region of the channel in the first semiconductor substrate at a position apart from the first surface of the first semiconductor substrate.

15. The image sensor according to claim 14, wherein the p-type doped Ge region is coupled to a negative voltage with respect to a voltage of the first semiconductor substrate.

16. The image sensor according to claim 14, further comprising a second semiconductor substrate, wherein the photodiode included in each one of the pixel circuits is disposed on a second semiconductor substrate that is bonded to the first semiconductor substrate having the pinch-off transistor such that the photodiode is coupled to the pinch-off transistor.

17. The image sensor according to claim 16, each of the plurality of pixel circuits further comprising:

a blocking layer disposed between the source and a second surface of the first semiconductor substrate, wherein the second surface is opposite to the first surface, wherein the blocking layer has a conductivity type that is opposite to a conductivity type of each of the source and the drain, and the blocking layer is configured to block the photo-carriers from flowing into the other region of the source and the drain directly.

18. The image sensor according to claim 16, wherein the first semiconductor substrate is a silicon (Si) substrate, and the second semiconductor substrate is a p-type doped Ge substrate, wherein the p-type doped Ge region of the photodiode is the p-type doped Ge substrate and the n-type doped Ge region is a doped region disposed in the p-type doped Ge substrate.

19. The image sensor according to claim 14, each of the plurality of pixel circuits further comprising an epitaxial layer disposed on the first semiconductor substrate, wherein the photodiode is disposed in the epitaxial layer that is coupled to the pinch-off transistor through the one region of the source and the drain.

* * * * *